(12) United States Patent
Yamamoto et al.

(10) Patent No.: US 9,572,264 B2
(45) Date of Patent: Feb. 14, 2017

(54) ELECTRONIC COMPONENT MODULE, BOARD, AND METHOD OF MANUFACTURING ELECTRONIC COMPONENT MODULE

(71) Applicant: FUJITSU COMPONENT LIMITED, Tokyo (JP)

(72) Inventors: Shinya Yamamoto, Tokyo (JP); Tohru Muramatsu, Tokyo (JP); Masakazu Muranaga, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 320 days.

(21) Appl. No.: 14/310,007

(22) Filed: Jun. 20, 2014

(65) Prior Publication Data

US 2015/0003023 A1  Jan. 1, 2015

(30) Foreign Application Priority Data

Jun. 26, 2013  (JP) ................. 2013-134190

(51) Int. Cl.
| | |
|---|---|
| H05K 9/00 | (2006.01) |
| H05K 3/30 | (2006.01) |
| H05K 3/40 | (2006.01) |
| H05K 1/02 | (2006.01) |
| H05K 3/34 | (2006.01) |

(52) U.S. Cl.
CPC ............. *H05K 3/30* (2013.01); *H05K 3/4007* (2013.01); *H05K 9/0028* (2013.01); *H05K 9/0035* (2013.01); *H05K 1/0218* (2013.01); *H05K 3/341* (2013.01); *H05K 2201/10371* (2013.01); *H05K 2203/167* (2013.01); *Y10T 29/49144* (2015.01)

(58) Field of Classification Search
CPC .......... H05K 9/00; H05K 3/30; H05K 9/0024; H05K 9/0035; H05K 3/341; H05K 3/4007
USPC ......................................... 361/748, 816, 818
See application file for complete search history.

(56) References Cited

U.S. PATENT DOCUMENTS

| | | | | |
|---|---|---|---|---|
| 5,754,402 | A * | 5/1998 | Matsuzaki | H01L 23/36 257/711 |
| 5,766,022 | A * | 6/1998 | Chapin | H01L 23/3675 257/E23.078 |
| 6,034,571 | A * | 3/2000 | Uno | H05K 3/403 331/67 |
| 6,079,099 | A * | 6/2000 | Uchida | H05K 3/3405 174/382 |
| 6,687,135 | B1 * | 2/2004 | Kitade | H05K 3/3405 174/365 |
| 2005/0012212 | A1 * | 1/2005 | Gilleo | B81C 3/002 257/737 |

(Continued)

FOREIGN PATENT DOCUMENTS

JP  2005-235806  9/2005

*Primary Examiner* — Eric Thomas
*Assistant Examiner* — Michael P McFadden
(74) *Attorney, Agent, or Firm* — IPUSA, PLLC

(57) ABSTRACT

An electronic component module includes a board having an electronic component mounted on a surface of the board and a shield case mounted on the surface of the board and covering the electronic component. The board includes a projecting part projecting from the surface of the board. The projecting part is formed of plating at a position along a sidewall of the shield case and is soldered to the shield case.

17 Claims, 23 Drawing Sheets

(56) References Cited

U.S. PATENT DOCUMENTS

2008/0174984 A1* 7/2008 Miyamoto ............. H05K 9/006
                                                    361/818
2009/0161324 A1* 6/2009 Sakamoto ............. H05K 9/006
                                                    361/728

* cited by examiner

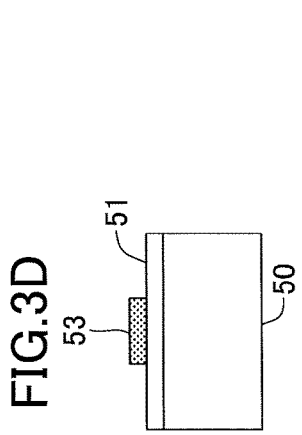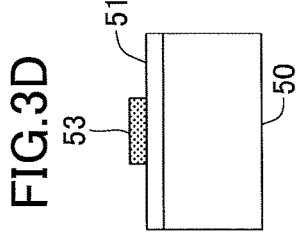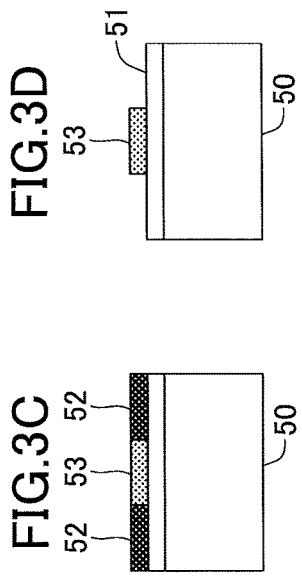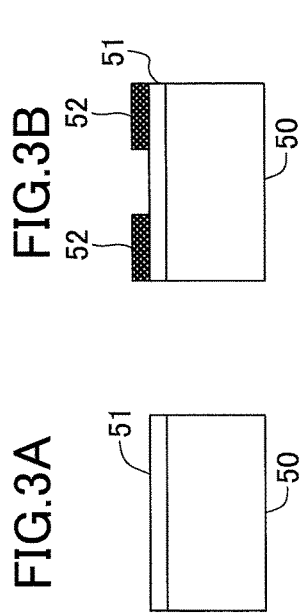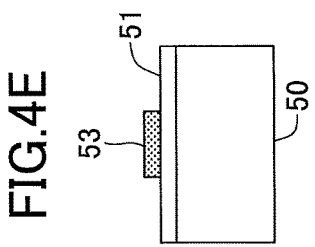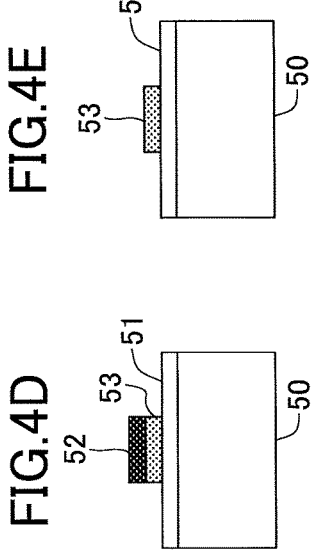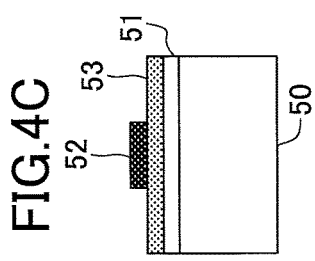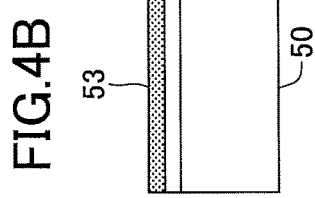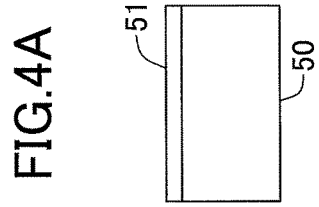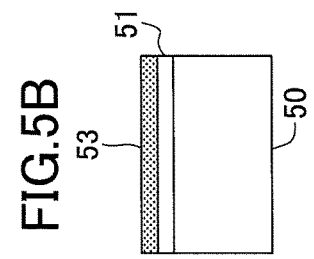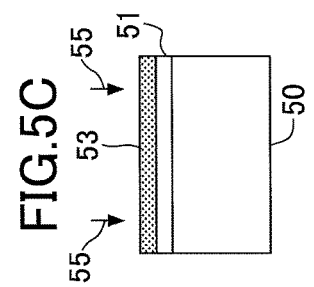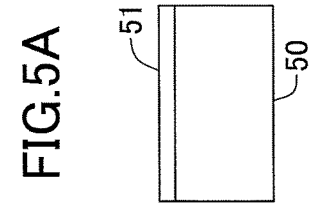

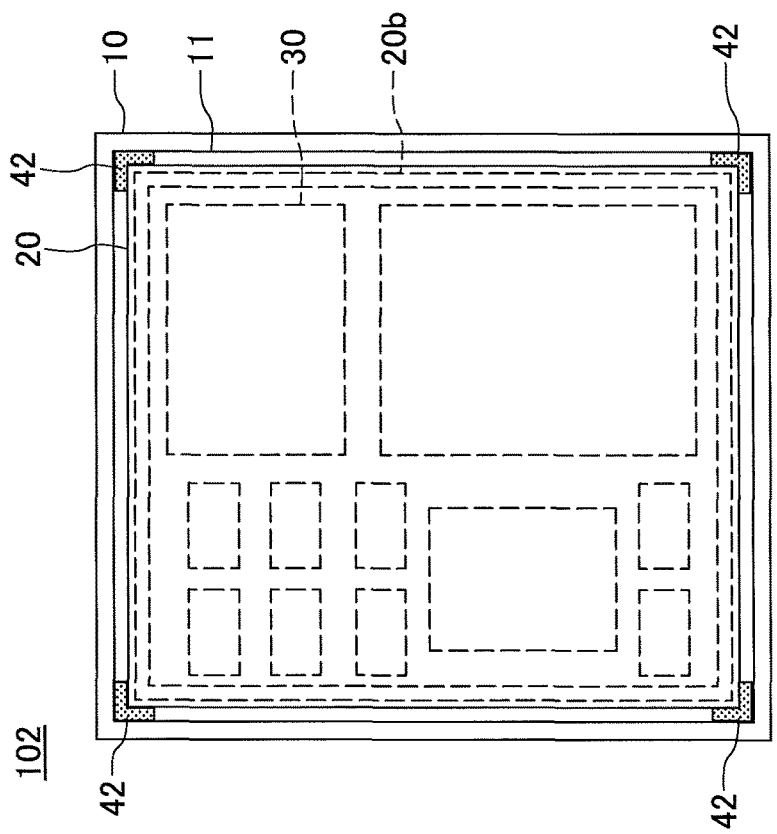
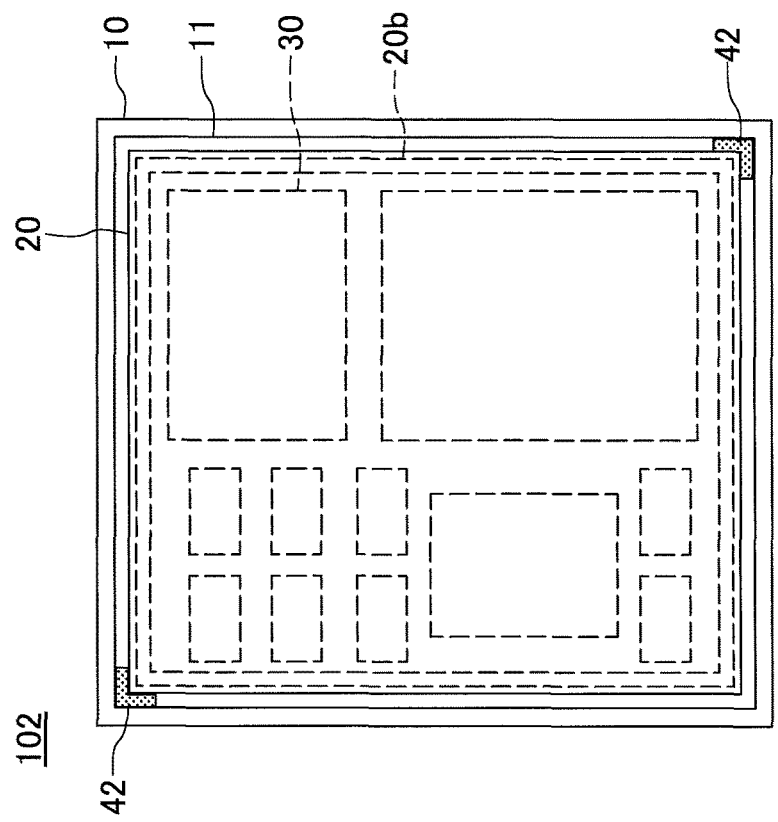

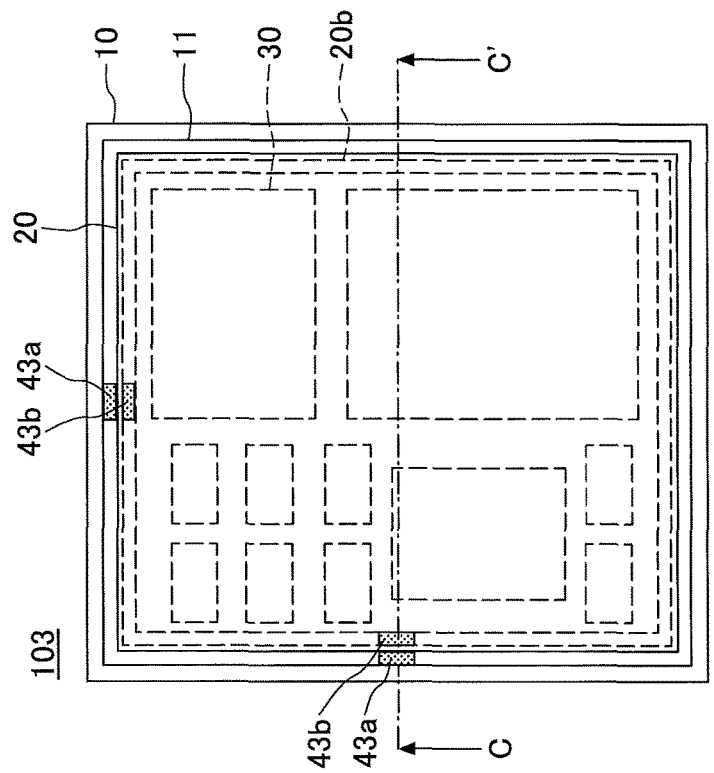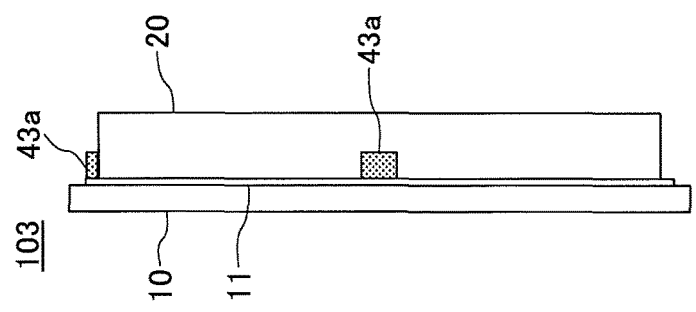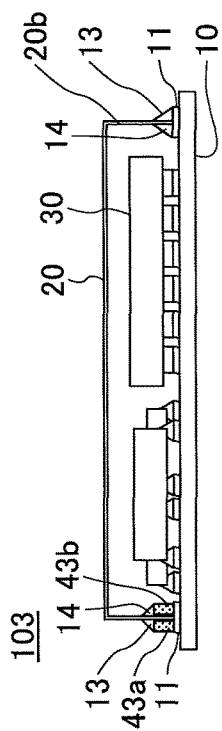

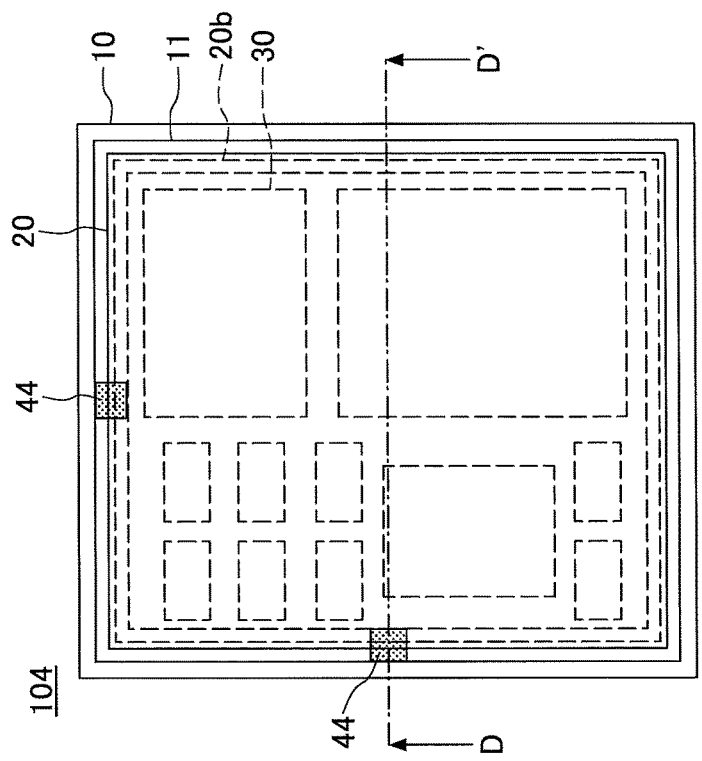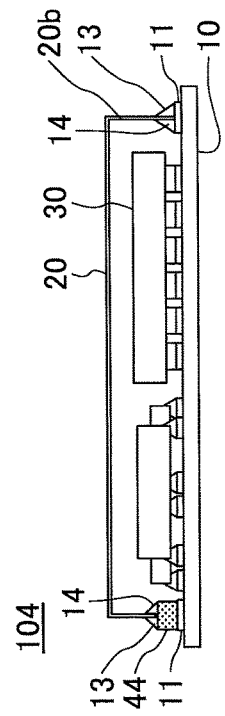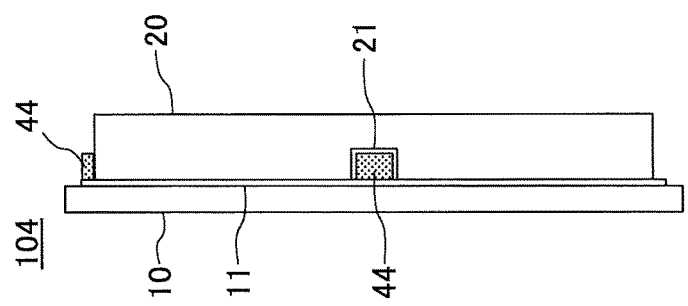
FIG.15B
FIG.15C
FIG.15A

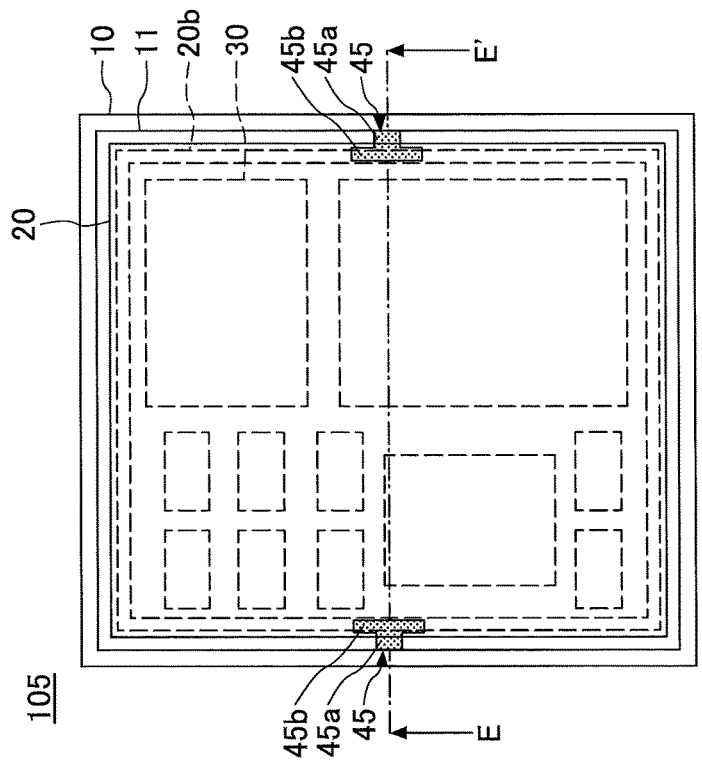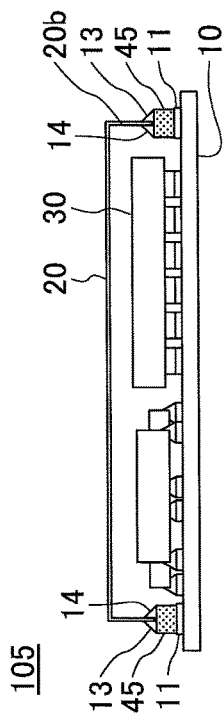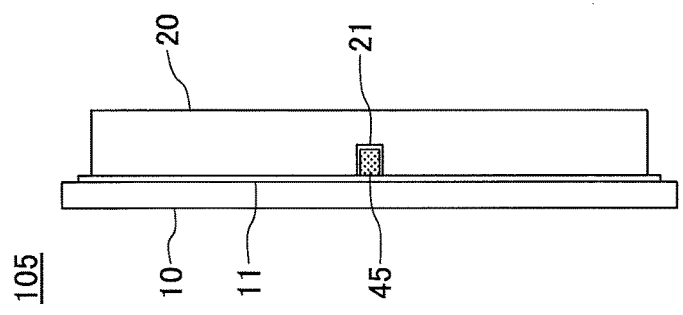

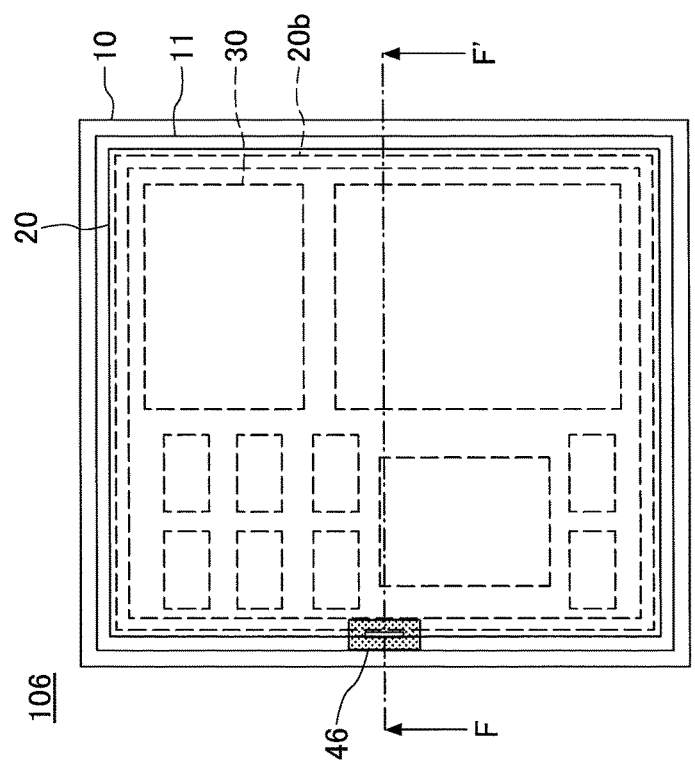
FIG.21A
FIG.21B
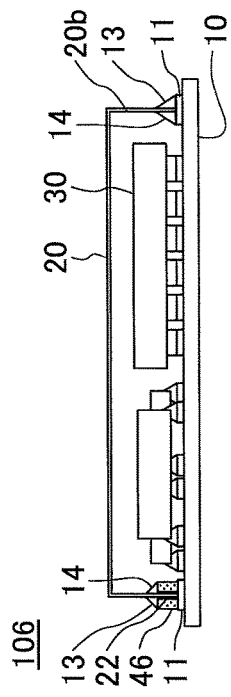
FIG.21C

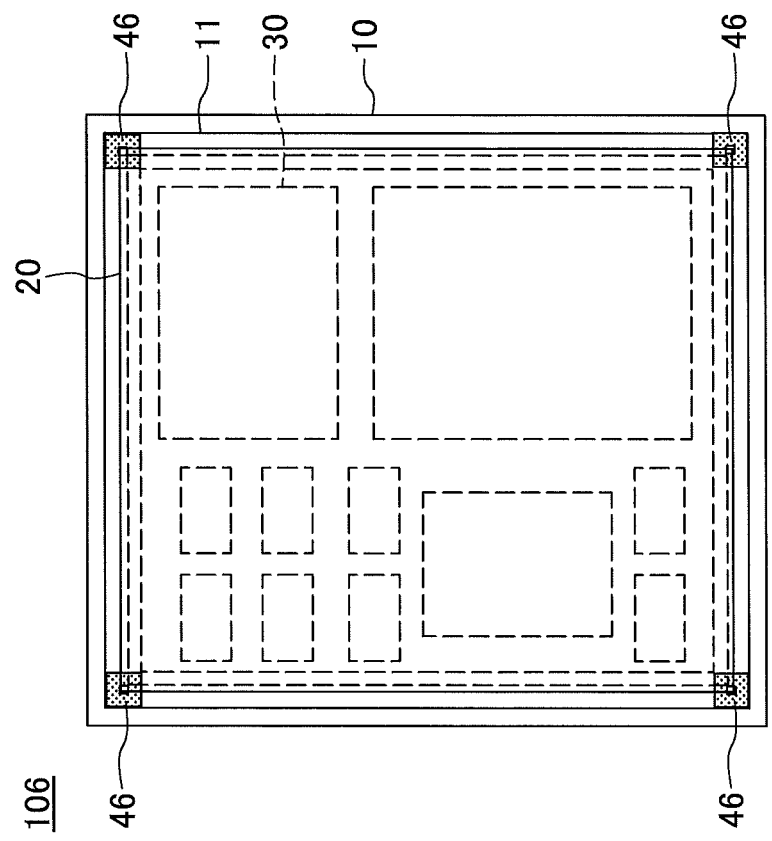
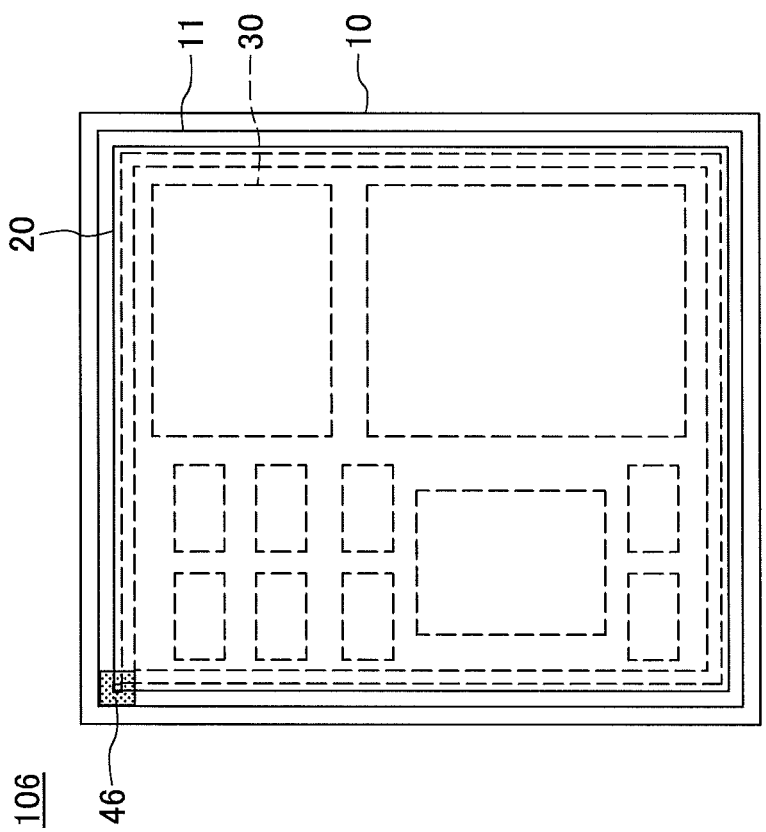

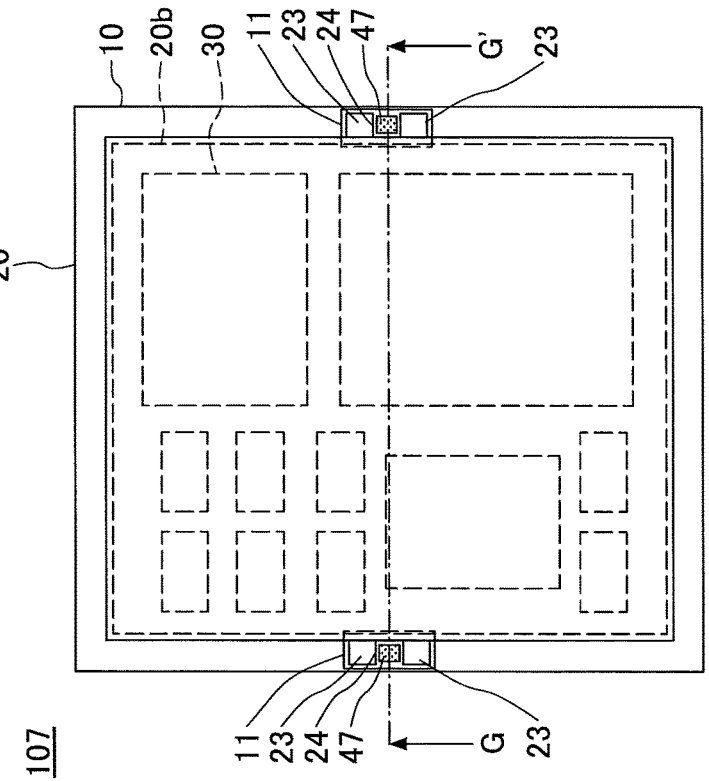
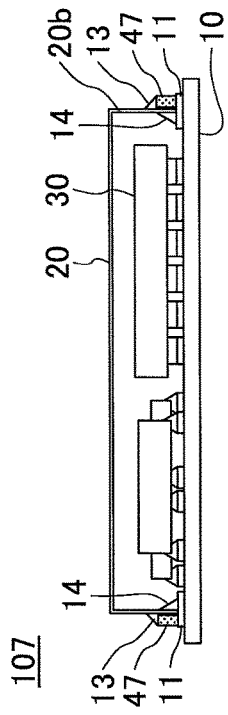
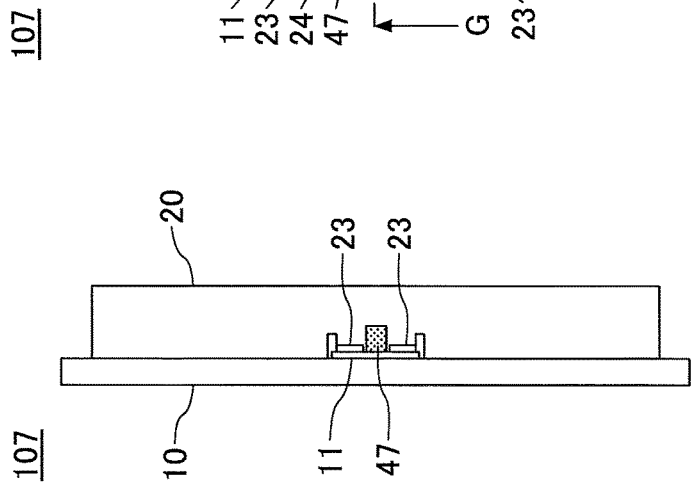

ELECTRONIC COMPONENT MODULE, BOARD, AND METHOD OF MANUFACTURING ELECTRONIC COMPONENT MODULE

CROSS-REFERENCE TO RELATED APPLICATION

The present application is based upon and claims the benefit of priority of Japanese Patent Application No. 2013-134190, filed on Jun. 26, 2013, the entire contents of which are incorporated herein by reference.

BACKGROUND OF THE INVENTION

1. Field of the Invention

The present invention relates to electronic component modules, boards, and methods of manufacturing an electronic component module.

2. Description of the Related Art

High-frequency modules used for radio communications are often provided with a metal shield case that covers electronic components mounted on a board so as not to be subject to external interference.

The shield case is generally mounted on a surface of the board along with other electronic components in the case of a small module. There is, however, a problem in that the misalignment of the shield case is likely to occur at mounting lands so that the shield case may be short-circuited with adjacent components or be poorly joined to the board (with a gap formed between the shield case and the board surface).

The shield case may be provided with claws and be fixed to the board by inserting the claws into through holes or end-face through holes of the board and soldering the claws. This method, however, has the disadvantage of an increase in the number of assembling steps and reduction in the area for mounting components.

Therefore, in order to prevent the misalignment of the shield case, an electronic component with a case in which metal balls are mounted at two or more points on a component mounting surface of a printed circuit board so as to be adjacent to a sidewall of the case has been proposed. (See, for example, Japanese Laid-Open Patent Application No. 2005-235806.)

SUMMARY OF THE INVENTION

According to an aspect of the invention, an electronic component module includes a board having an electronic component mounted on a surface of the board and a shield case mounted on the surface of the board and covering the electronic component. The board includes a projecting part projecting from the surface of the board. The projecting part is formed of plating at a position along a sidewall of the shield case and is soldered to the shield case.

According to an aspect of the invention, a board on which an electronic component and a shield case covering the electronic component are to be mounted includes a projecting part projecting from a surface of the board so as to be soldered to the shield case. The projecting part is formed of plating at a position along a sidewall of the shield case to be mounted.

According to an aspect of the invention, a method of manufacturing an electronic component module includes forming a projecting part on a board by plating so that the projecting part projects from a surface of the board at a position along a sidewall of a shield case to be mounted on the board to cover an electronic component on the board, and soldering the projecting part and the shield case.

BRIEF DESCRIPTION OF THE DRAWINGS

FIGS. 3A, 3B, 3C and 3D are diagrams illustrating a method of forming a projecting post according to the first embodiment;

FIGS. 4A, 4B, 4C, 4D and 4E are diagrams illustrating a method of forming a projecting post according to the first embodiment;

FIGS. 5A, 5B, 5C and 5D are diagrams illustrating a method of forming a projecting post according to the first embodiment;

FIGS. 9A and 9B are schematic diagrams illustrating configurations of the electronic component module according to the second embodiment;

FIGS. 11A, 11B and 11C are schematic diagrams illustrating a configuration of an electronic component module according to a third embodiment;

FIGS. 15A, 15B and 15C are schematic diagrams illustrating a configuration of an electronic component module according to a fourth embodiment;

FIGS. 18A, 18B and 18C are schematic diagrams illustrating a configuration of an electronic component module according to a fifth embodiment;

FIGS. 21A, 21B and 21C are schematic diagrams illustrating a configuration of an electronic component module according to a sixth embodiment;

FIGS. 23A and 23B are schematic diagrams illustrating configurations of the electronic component module according to the sixth embodiment;

FIGS. 24A, 24B and 24C are schematic diagrams illustrating a configuration of an electronic component module according to a seventh embodiment.

DESCRIPTION OF THE EMBODIMENTS

Figure 1:
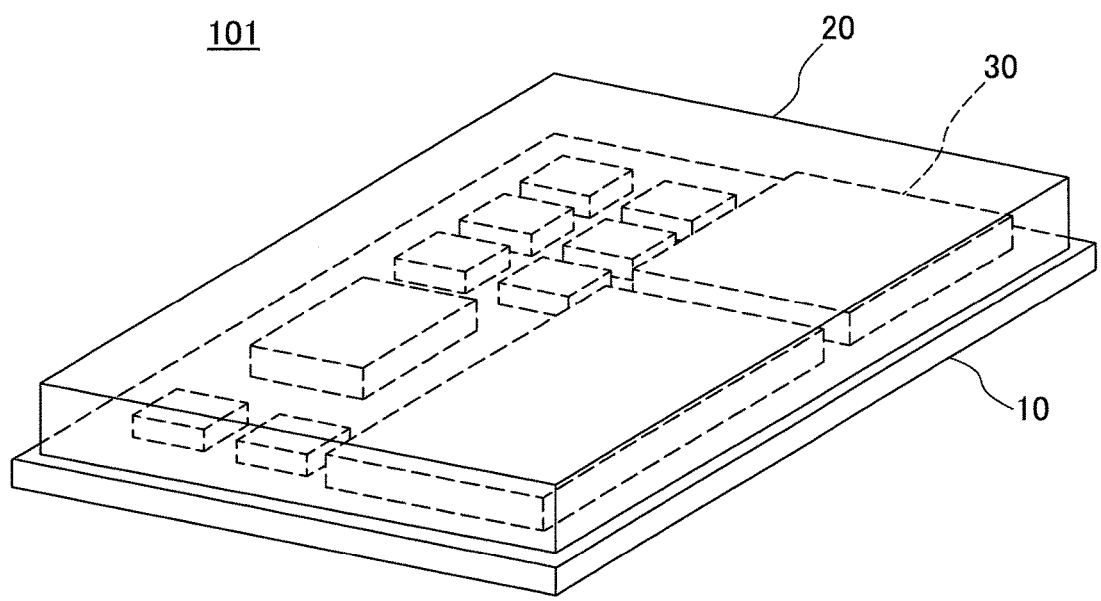
FIG. 1 is a schematic diagram illustrating a configuration of an electronic component module according to a first embodiment.

Embodiments of the present invention are described below with reference to the accompanying drawings. In the drawings, the same elements are referred to by the same reference numerals, and their description may not be repeated.

[First Embodiment]

Figure 2A:
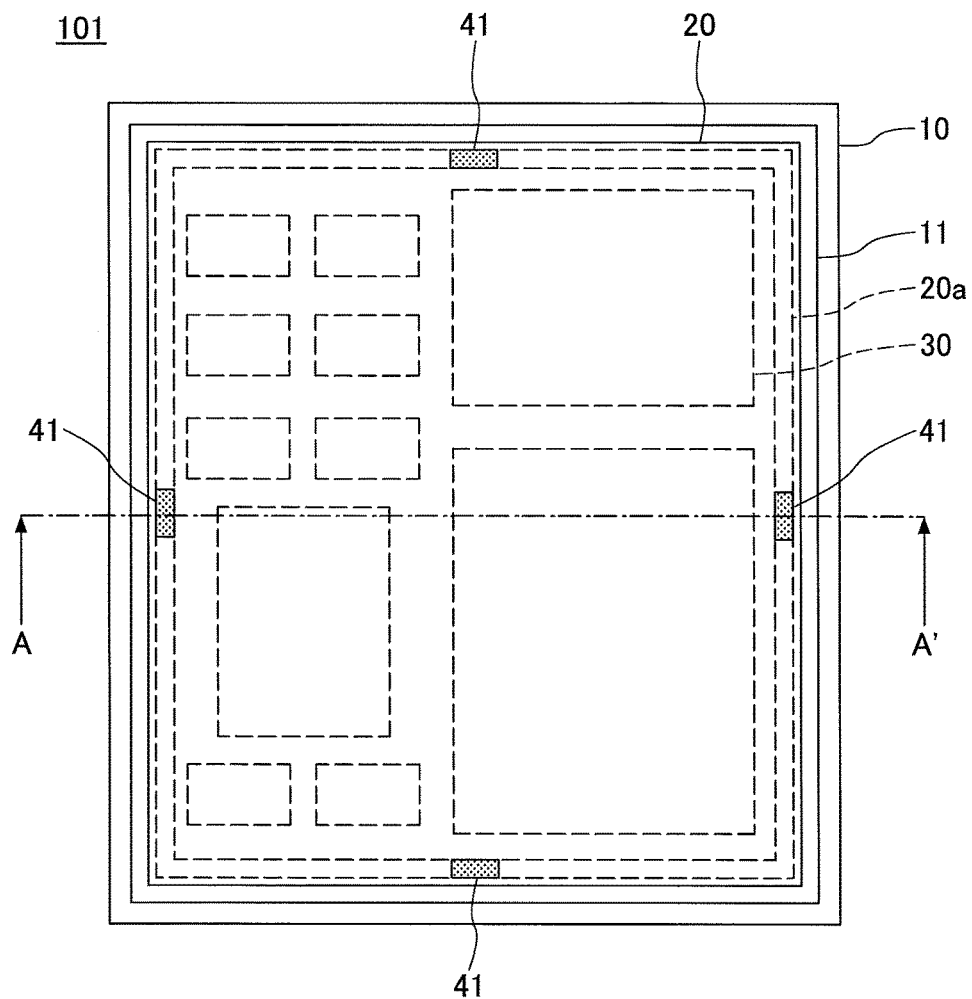
FIGS. 2A and 2B are schematic diagrams illustrating a configuration of the electronic component module according to the first embodiment.
Figure 2B:
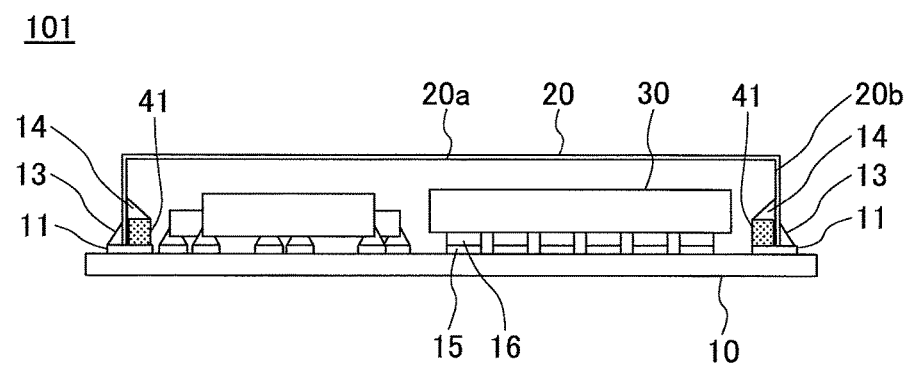

A configuration of an electronic component module 101 according to a first embodiment is outlined in FIG. 1 and FIGS. 2A and 2B by way of example. FIG. 1 is a perspective view of the electronic component module 101. FIG. 2A is a schematic plan view of the electronic component module 101. FIG. 2B is a schematic cross-sectional view of the electronic component module 101 taken along a plane including line A-A' of FIG. 2A.

As illustrated in FIGS. 1, 2A and 2B, the electronic component module 101 includes a board 10, a shield case 20, and electronic components 30. The shield case 20 includes a base 20a and a sidewall 20b. The sidewall 20b includes four sides extending perpendicularly from the four side edges of the base 20a.

As illustrated in FIG. 2A, the board 10 is a printed board having a rectangular shape in a plan view. The electronic components 30 such as semiconductor devices, resistors, inductors, and capacitors are mounted on a surface of the board 10.

As illustrated in FIG. 2B, each of the electronic components 30 is mounted on the surface of the board 10 by being joined to one or more mounting lands 15, which are formed of copper foil or the like on the surface of the board 10, with solder 16.

Furthermore, the box-shaped shield case 20 is mounted on the surface of the board 10. The shield case 20 is formed of, for example, a conductive metal, and covers an area of the board 10 for mounting the electronic components 30. For example, the shield case 20 is fixed onto a case land 11 of copper foil or the like formed on the surface of the board 10 along a position at which the sidewall 20b of the shield case 20 is joined to the board 10. Thus, the shield case 20 covers the electronic components 30 and protects the electronic components 30 from external interference. In the following description, the surface of the board 10 includes a surface of the case land 11 unless otherwise specified.

As illustrated in FIGS. 2A and 2B, projecting posts 41 projecting from the surface of the board 10 are formed at positions along an interior surface of the sidewall 20b on the case land 11 of the board 10. The projecting posts 41 are formed with one projecting post 41 for each side of the sidewall 20b. The projecting posts 41 may be in contact with the interior surface of the sidewall 20b or a gap may be formed between the projecting posts 41 and the interior surface of the sidewall 20b.

The shield case 20 is placed on the board 10 so that the interior surface of the sidewall 20b extends along the projecting posts 41, so that the shield case 20 is positioned on the case land 11 of the board 10. As illustrated in FIG. 2B, with the position of the shield case 20 being determined, the shield case 20 is fixed to the board 10 and the projecting posts 41 by soldering the exterior surface and the interior surface of the sidewall 20b to the board 10 and the projecting posts 41 by solder 13 on the exterior surface side and solder 14 on the interior surface side.

Methods of forming the projecting posts 41 are described. FIGS. 3A, 3B, 3C and 3D, FIGS. 4A, 4B, 4C, 4D and 4E, and FIGS. 5A, 5B, 5C and 5D are diagrams illustrating methods of forming the projecting posts 41. The projecting posts 41 are formed at predetermined positions on a surface of copper foil 51 provided on a surface of a base 50 as the case land 11. In the following description, the projecting posts 41 may be collectively referred to as "projecting post 41."

For example, the base 50 is provided with the copper foil 51 as illustrated in FIG. 3A. Then, as illustrated in FIG. 3B, a masking film 52 is printed on a surface of the copper foil 51 except for a part where the projection post 41 is to be formed. Then, copper plating is performed on the structure of FIG. 3B to form a copper plating layer 53 in the unmasked part as illustrated in FIG. 3C. Next, by removing the masking film 52, the copper plating layer 53 left on the surface of the copper foil 51 is formed as the projecting post 41 as illustrated in FIG. 3D.

Alternatively, as illustrated in FIG. 4B, the copper plating layer 53 is formed on the entire surface of the copper foil 51 provided on the base 50 as illustrated in FIG. 4A. Then, as illustrated in FIG. 4C, the masking film 52 is printed on part of a surface of the copper plating layer 53 where the projecting post 41 is to be formed. Then, as illustrated in FIG. 4D, the unmasked part of the copper plating layer 53 is removed by etching. Then, by removing the masking film 52, the copper plating layer 53 left on the surface of the copper foil 51 is formed as the projecting post 41 as illustrated in FIG. 4E.

Alternatively, as illustrated in FIG. 5B, the copper plating layer 53 is formed on the entire surface of the copper foil 51 provided on the base 50 as illustrated in FIG. 5A. Then, the copper plating layer 53 is removed by laser light 55 except for a part where the projecting post 41 is to be formed as illustrated in FIG. 5C, so that the copper plating layer 53 left on the surface of the copper foil 51 is formed as the projecting post 41 as illustrated in FIG. 5D.

Thus, the projecting posts 41 are formed on the copper foil 51 of the base 50 with a height that makes it possible to position the shield case 20 (for example, 100 μm) by the plating process illustrated by way of example in FIGS. 3A through 3D, FIGS. 4A through 4E, or FIGS. 5A through 5D.

Alternatively, the projecting posts 41 may be formed by plating a material different from copper or may be formed by a method other than those described above. Furthermore, the projecting posts 41 is not limited to the shape illustrated in this embodiment as long as the projecting posts 41 project from the surface of the board 10 at positions along the sidewall 20b and are so shaped as to make it possible to position the shield case 20.

The shield case 20 is soldered to the case land 11 and the projecting posts 41 with the projecting posts 41 being formed on the surface of the board 10 by the above-described plating process and the shield case 20 being positioned with reference to the projecting posts 41.

Figure 6A:
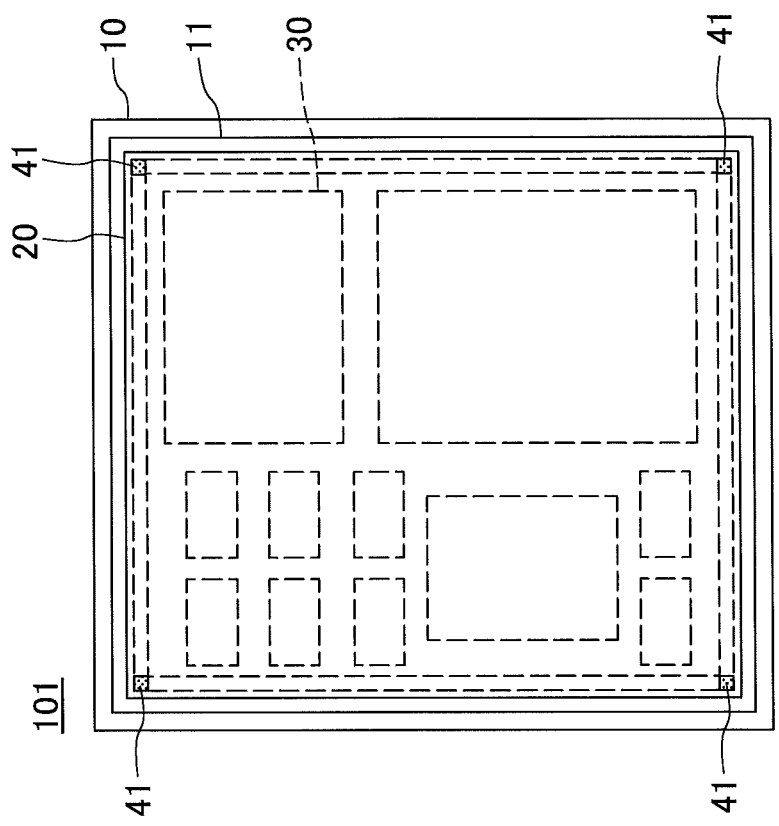
FIGS. 6A and 6B are schematic diagrams illustrating configurations of the electronic component module according to the first embodiment.
Figure 6B:
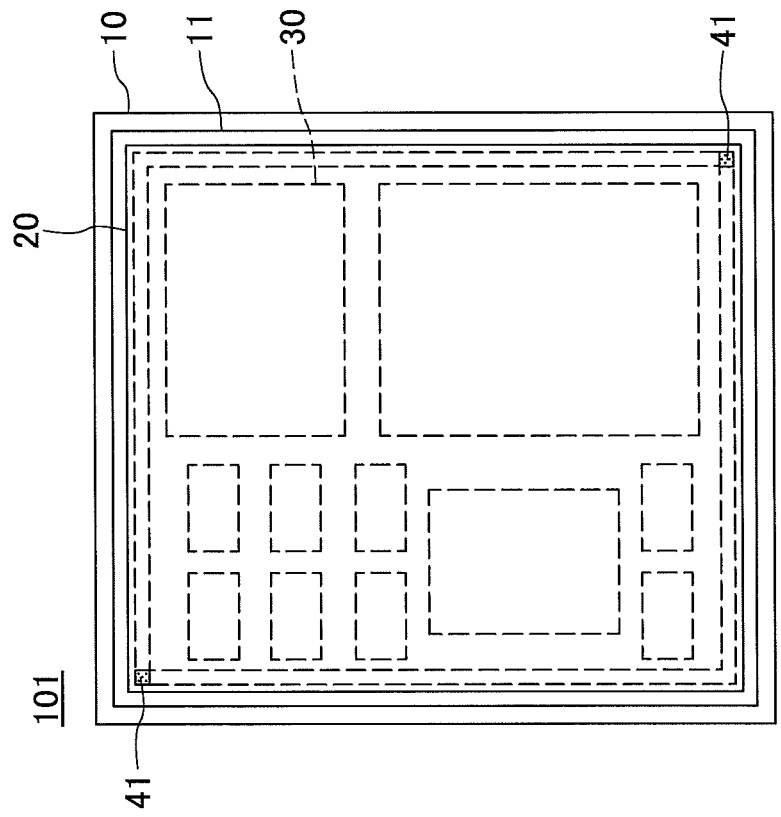

Furthermore, the projecting posts 41 may be provided at positions other than those corresponding to the respective centers of the sides of the sidewall 20b or may be provided with two or more projecting posts 41 for each side of the sidewall 20b, as long as it is possible to position the shield case 20. For example, the projecting posts 41 may be provided at positions corresponding to diagonal corners of the shield case 20 as illustrated in FIG. 6A. The shield case 20 is positioned on the board 10 by the two projecting posts 41 provided at diagonal positions. Alternatively, the projecting posts 41 may be provided at positions corresponding to all the corners of the shield case 20 as illustrated in FIG. 6B.

Figure 7:
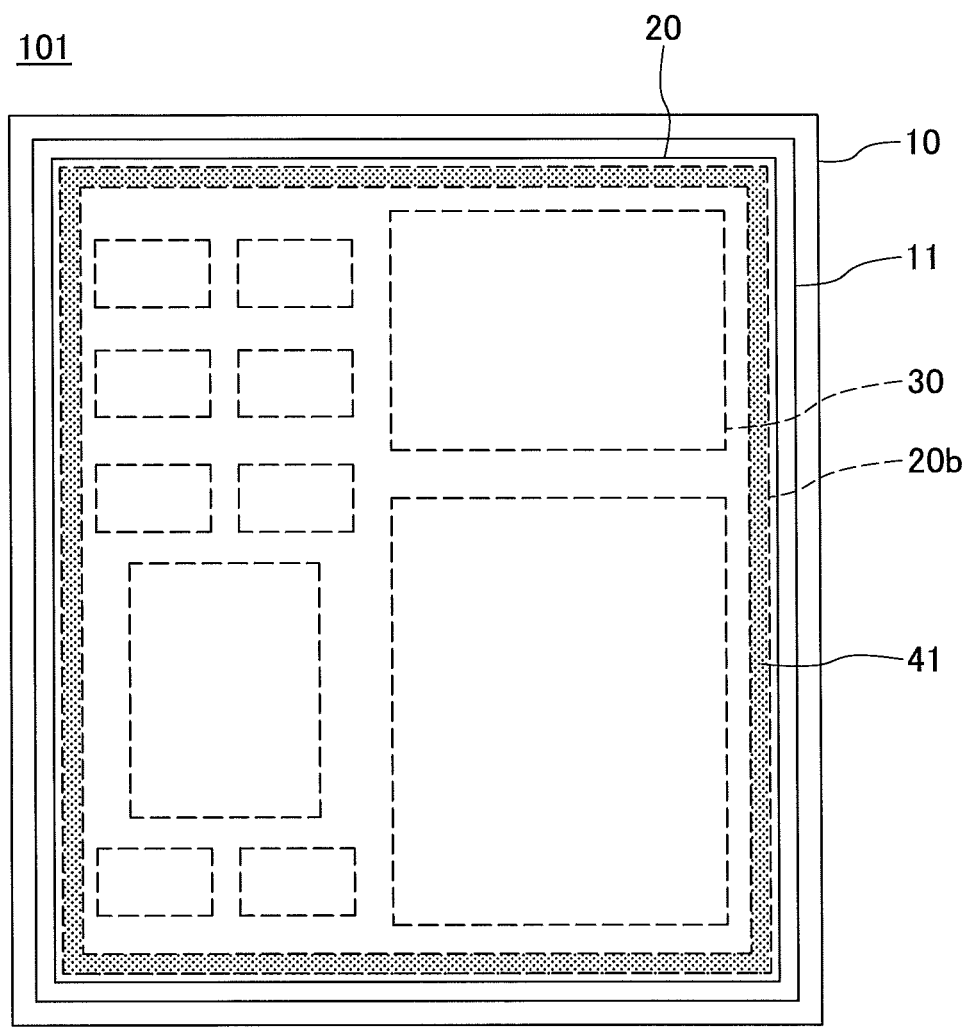
FIG. 7 is a schematic diagram illustrating a configuration of the electronic component module according to the first embodiment.

Furthermore, as illustrated in FIG. 7, the projecting post 41 may also be formed into a frame shape along the interior surface of the sidewall 20b. The shield case 20 is positioned on the board 10 by placing the shield case 20 so that the interior surface of the sidewall 20b extends along the frame-shaped projecting post 41, so that the shield case 20 is fixed to the board 10 without misalignment.

As described above, according to the electronic component module 101 of the first embodiment, the position of the shield case 20 is determined by the projecting posts 41 formed on the board 10, and is fixed on the surface of the board 10 without misalignment. Furthermore, the projecting posts 41 are plating layers formed on the case land 11, and are not displaced in a heating process for mounting the electronic components 30 or the shield case 20. Accordingly, the shield case 20 is fixed at a predetermined position and is prevented from being short-circuited with adjacent components or being poorly joined to the board 10 (with a gap formed between the shield case 20 and the case land 11 on the board 10).

[Second Embodiment]

Next, a second embodiment is described with reference to the drawings. In the second embodiment, the same elements as those of the above-described embodiment are referred to by the same reference numerals, and their description is omitted.

Figure 8A:
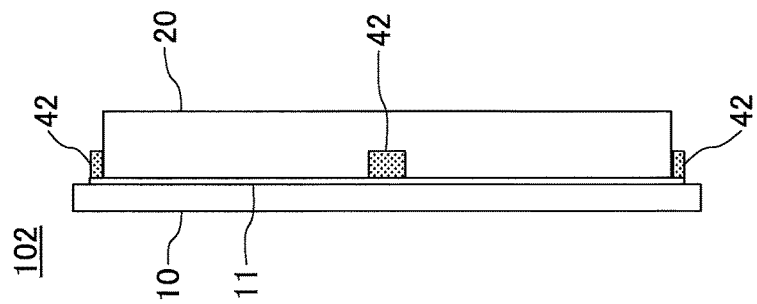
FIGS. 8A, 8B and 8C are schematic diagrams illustrating a configuration of an electronic component module according to a second embodiment.
Figure 8B:
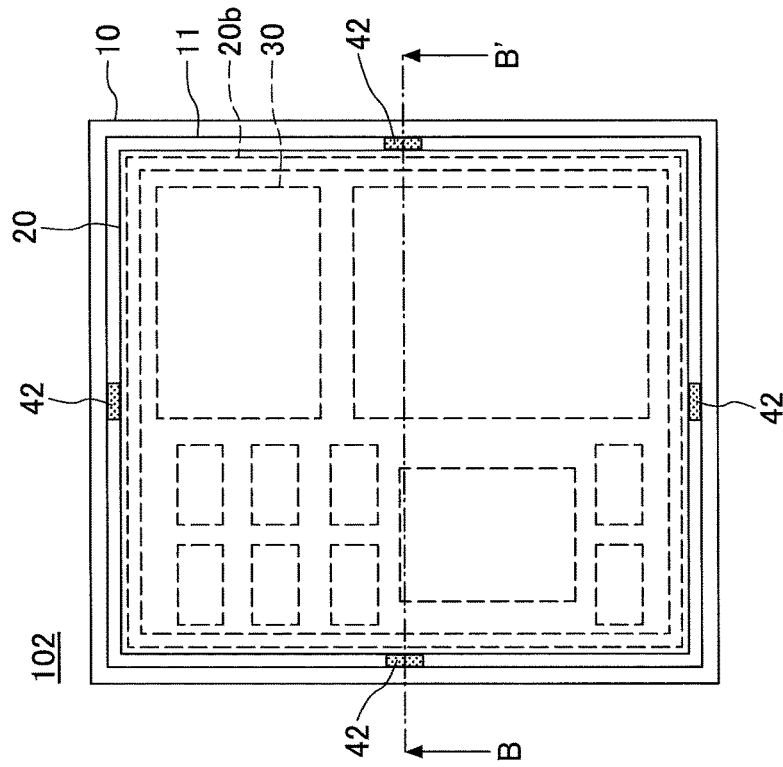
Figure 8C:
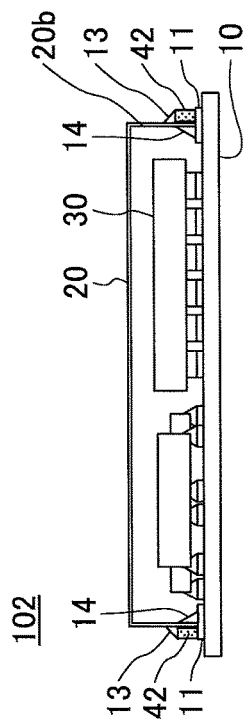

FIGS. 8A, 8B and 8C are schematic diagrams illustrating a configuration of an electronic component module 102 according to the second embodiment. FIGS. 8A and 8B are a schematic plan view and a schematic side view of the electronic component module 102, respectively. FIG. 8C is a schematic cross-sectional view of the electronic component module 102 taken along a plane including line B-B' of FIG. 8B.

As illustrated in FIGS. 8A through 8C, the electronic component module 102 includes the board 10, the electronic components 30 mounted on the board 10, and the shield case 20 mounted on the board 10 and covering the electronic components 30.

The board 10 includes projecting posts 42 at positions along the exterior surface of the sidewall 20b of the shield case 20 on the case land 11. As illustrated in FIG. 8B, the projecting posts 42 are formed with one projecting post 42 for each side of the sidewall 20b. The shield case 20 is positioned on the board 10 by 6 lacing the shield case 20 so that the exterior surface of the sidewall 20b extends along the projecting posts 42.

As illustrated in FIG. 8C, with the position of the shield case 20 being determined with the exterior surface of the sidewall 20b being placed along the projecting posts 42, the shield case 20 has the exterior surface and the interior surface of the sidewall 20b fixed to the board 10 and the projecting posts 42 by the solder 13 on the exterior surface side and the solder 14 on the interior surface side.

Like in the first embodiment, the projecting posts 42 are formed on the case land 11 of the board 10 by a plating process. The projecting posts 42 may have a shape different from that illustrated in this embodiment as long as the projecting posts 42 project from the surface of the board 10 at positions along the exterior surface of the sidewall 20b and are so shaped as to make it possible to position the shield case 20.

Furthermore, the projecting posts 42 may be provided at positions other than those corresponding to the respective centers of the sides of the sidewall 20b or may be provided with two or more projecting posts 42 for each side of the sidewall 20b, as long as it is possible to position the shield case 20. Alternatively, as illustrated in, for example, FIG. 9A, the projecting posts 42 may be provided at positions corresponding to diagonal corners of the shield case 20 so as to have a hook shape along the corresponding corners of the shield case 20. The hook-shaped projecting posts 42 may be provided at positions corresponding to all the corners of the shield case 20 as illustrated in FIG. 9B. The shield case 20 is positioned by placing the shield case 20 so that the external surfaces of the corners of the sidewall 20b are along the hook-shaped projecting posts 42.

Figure 10:
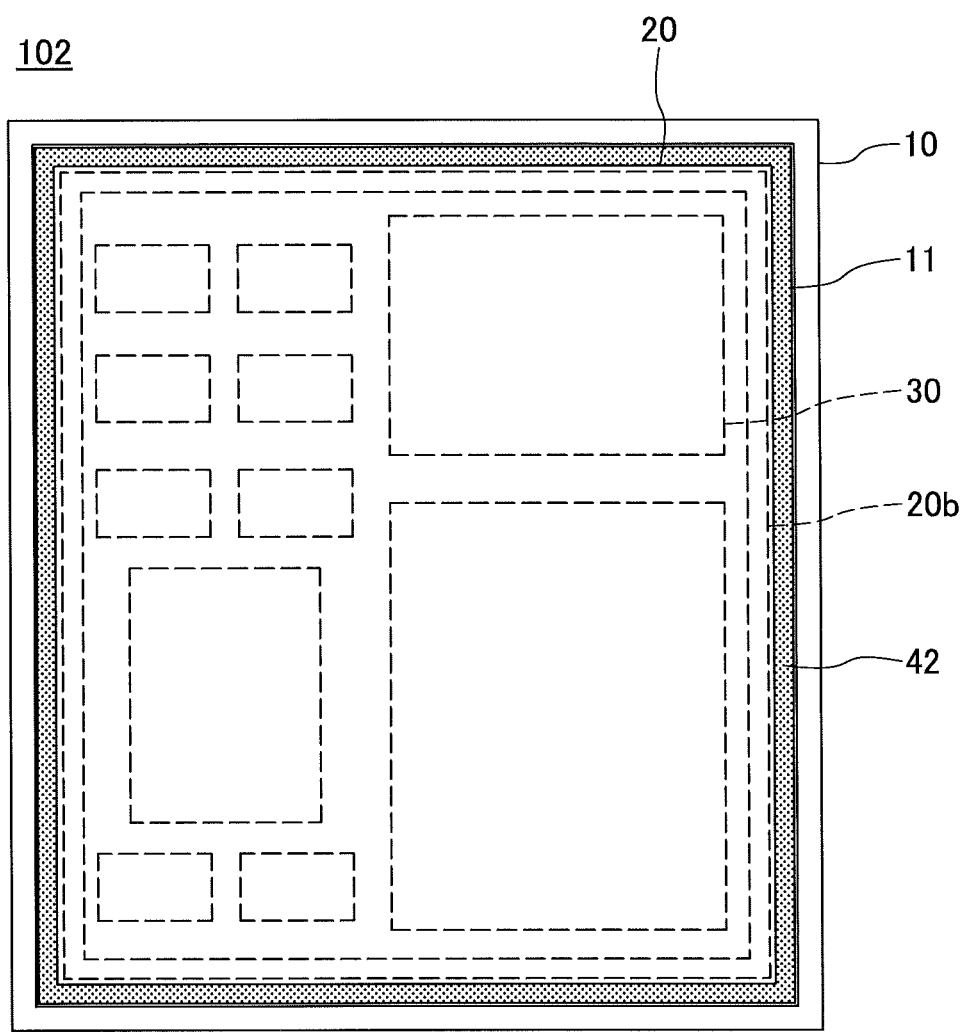
FIG. 10 is a schematic diagram illustrating a configuration of the electronic component module according to the second embodiment.

Alternatively, the projecting post 42 may be formed into a frame shape along the external surface of the sidewall 20b as illustrated in FIG. 10. The shield case 20 is positioned by placing the shield case 20 so that the exterior surface of the sidewall 20b is along the frame-shaped projecting post 42, so that the shield case 20 is fixed to the board 10 without misalignment.

As described above, according to the electronic component module 102 of the second embodiment, the position of the shield case 20 is determined by the projecting posts 42 formed on the board 10, and is fixed on the surface of the board 10 without misalignment.

[Third Embodiment]

Next, a third embodiment is described with reference to the drawings. In the third embodiment, the same elements as those of the above-described embodiments are referred to by the same reference numerals, and their description is omitted.

FIGS. 11A, 11B and 11C are schematic diagrams illustrating a configuration of an electronic component module 103 according to the third embodiment. FIGS. 11A and 11B are a schematic side view and a schematic plan view of the electronic component module 103, respectively. FIG. 11C is a schematic cross-sectional view of the electronic component module 103 taken along a plane including line C-C' of FIG. 11B.

As illustrated in FIGS. 11A through 11C, the electronic component module 103 includes the board 10, the electronic components 30 mounted on the board 10, and the shield case 20 mounted on the board 10 and covering the electronic components 30.

The board 10 includes projecting posts 43a at positions along the exterior surface of the sidewall 20b of the shield case 20 on the case land 11 and has projecting posts 43b at positions along the interior surface of the sidewall 20b on the case land 11. As illustrated in FIG. 11B, the projecting posts 43a are formed with one projecting post 43a for each of two adjacent sides of the sidewall 20b, and the projecting posts 43b are formed with one projecting post 43b for each of the two adjacent sides of the sidewall 20b. The shield case 20 is positioned on the board 10 by placing the shield case 20 so that the sidewall 20b is held between the projecting posts 43a and 43b.

As illustrated in FIG. 11C, with the position of the shield case 20 being determined by the projecting posts 43a and 43b, the shield case 20 has the exterior surface and the interior surface of the sidewall 20b fixed to the board 10 and the projecting posts 43a and 43b by the solder 13 on the exterior surface side and the solder 14 on the interior surface side.

Like in the first embodiment, the projecting posts 43a and 43b are formed on the case land 11 of the board 10 by a plating process. The projecting posts 43a and 43b may have a shape different from that illustrated in this embodiment as long as the projecting posts 43a and 43b project from the surface of the board 10 at positions along the exterior surface and the interior surface of the sidewall 20b, respectively, and are so shaped as to make it possible to position the shield case 20.

Figure 12:
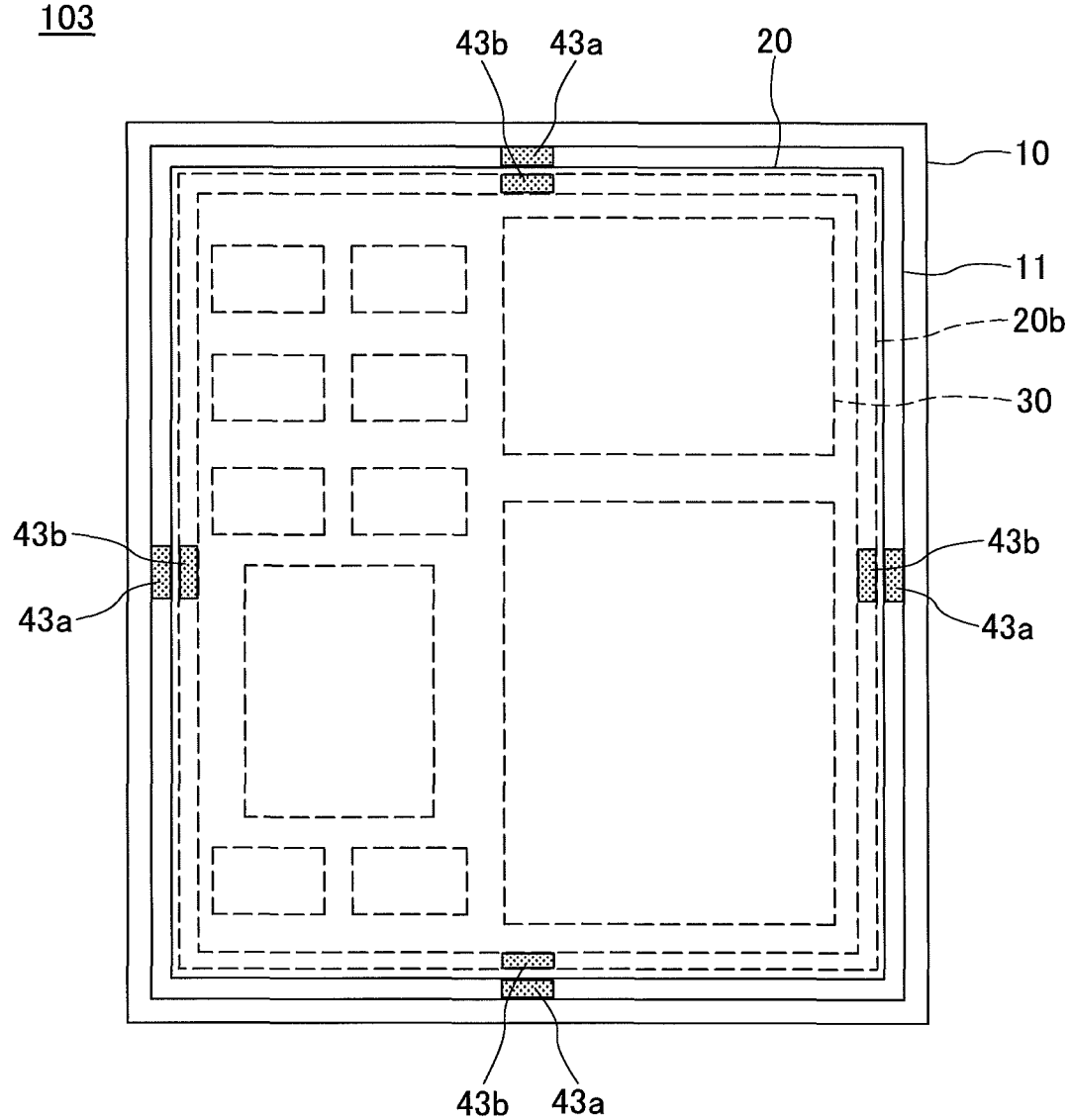
FIG. 12 is a schematic diagram illustrating a configuration of the electronic component module according to the third embodiment.

Furthermore, the projecting posts 43a and 43b may be provided at positions other than those corresponding to the respective centers of the sides of the sidewall 20b or may be provided with two or more projecting posts 43a and two or more projecting posts 43b for each side of the sidewall 20b, as long as it is possible to position the shield case 20. Furthermore, the projecting posts 43a and the projecting posts 43b may be provided at different positions relative to a side of the shield case 20. That is, the projecting posts 43a and the projecting posts 43b may not be disposed to face toward each other. The projecting posts 43a and 43b may be provided with one projecting post 43a and one projecting post 43b for each side of the sidewall 20b as illustrated in FIG. 12 or with two or more projecting posts 43a and two or more projecting posts 43b for each side of the sidewall 20b. Furthermore, the number of projecting posts 43a and the number of projecting posts 43b provided for each side of the sidewall 20b may be different.

Figure 13:
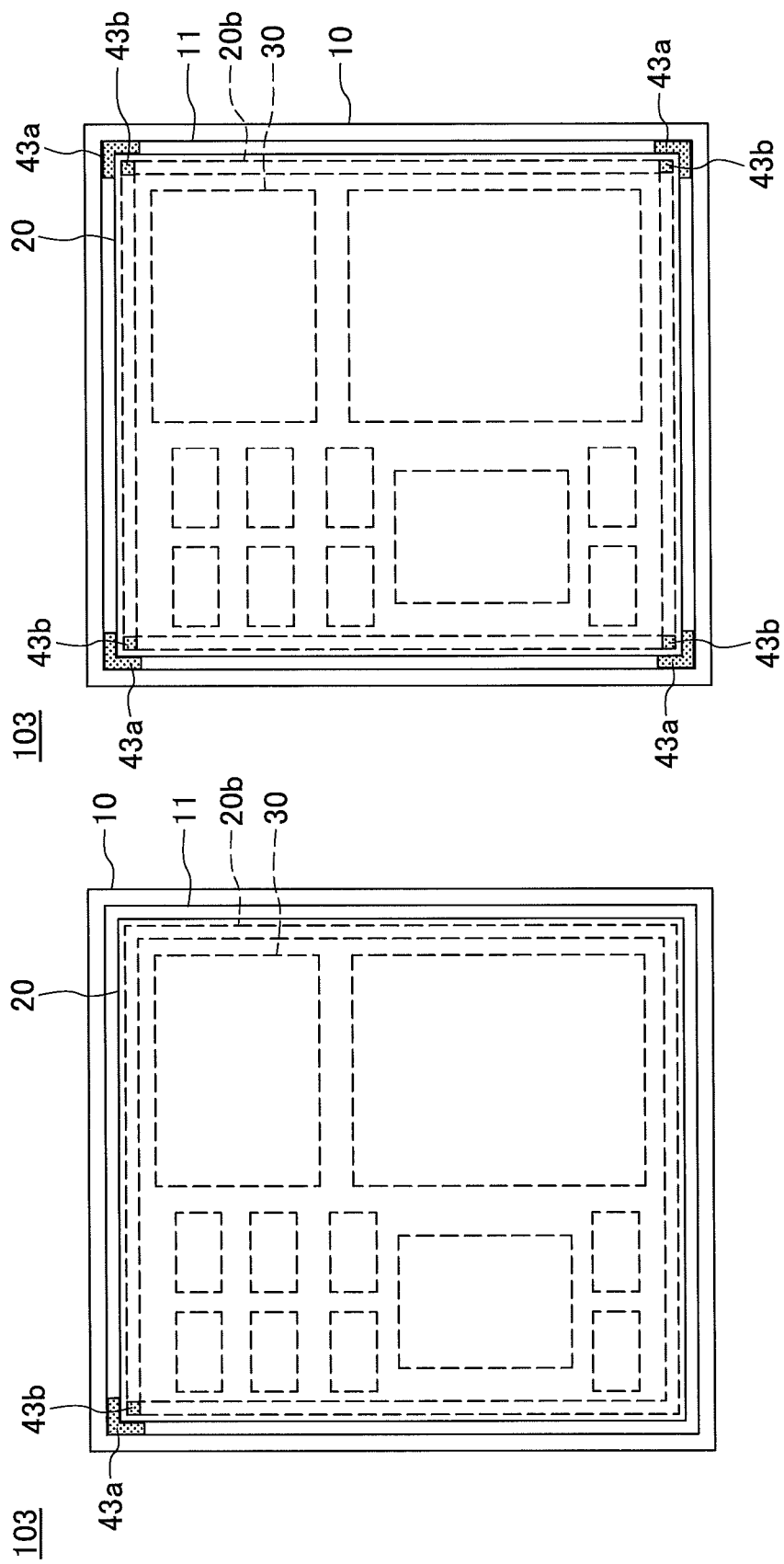
FIGS. 13A and 13B are schematic diagrams illustrating configurations of the electronic component module according to the third embodiment.

Furthermore, for example, as illustrated in FIG. 13A, the projecting post 43a may be provided to have a hook shape along the exterior surface of a corner of the sidewall 20b, and the projecting post 43b may be provided to face toward the projecting post 43a to have a pillar shape along the interior surface of the sidewall 20b. The shield case 20 is positioned by placing the shield case 20 so that the corner of the shield case 20 is held between the projecting post 43a and the projecting post 43b. Alternatively, the hook-shaped projecting post 43a and the pillar-shaped projecting post 43b may be provided at all of the corners of the shield case 20 as illustrated in FIG. 13B, or may be provided at multiple corners of the shield case 20.

Figure 14:
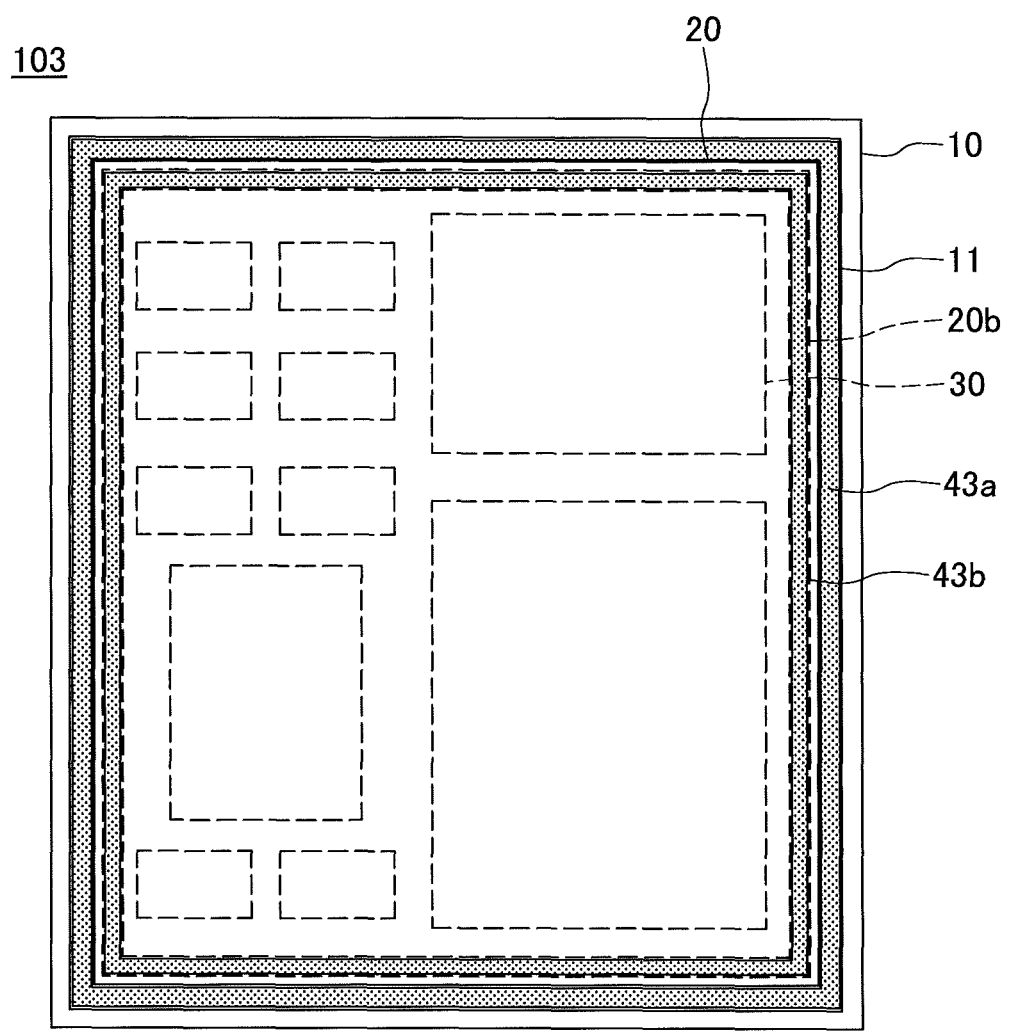
FIG. 14 is a schematic diagram illustrating a configuration of the electronic component module according to the third embodiment.

Furthermore, for example, as illustrated in FIG. 14, the projecting post 43a and the projecting post 43b may be provided in a frame shape along the exterior surface and the interior surface of the sidewall 20b, respectively. The shield case 20 is positioned on the board 10 by placing the shield case 20 so that the shield case 20 is held between the frame-shaped projecting posts 43a and 43b.

Furthermore, the frame-shaped projecting post 43a may be formed along the exterior surface of the sidewall 20b and the pillar-shaped projecting post or posts 43b may be formed along the interior surface of the sidewall 20b. Alternatively, the pillar-shaped projecting post or posts 43a may be formed along the exterior surface of the sidewall 20b and the frame-shaped projecting post 43b may be formed along the interior surface of the sidewall 20b. In either case, the shield case 20 is positioned on the board 10 by placing the shield case 20 so that the shield case 20 is held between the projecting posts 43a and 43b.

As described above, according to the electronic component module 103 of the third embodiment, the position of the shield case 20 is determined by the projecting posts 43a and 43b formed on the board 10, so that the shield case 20 is fixed on the surface of the board 10 without misalignment.

[Fourth Embodiment]

Next, a fourth embodiment is described with reference to the drawings. In the fourth embodiment, the same elements as those of the above-described embodiments are referred to by the same reference numerals, and their description is omitted.

FIGS. 15A, 15B and 15C are schematic diagrams illustrating a configuration of an electronic component module 104 according to the fourth embodiment. FIGS. 15A and 15B are a schematic side view and a schematic plan view of the electronic component module 104, respectively. FIG. 15C is a schematic cross-sectional view of the electronic component module 104 taken along a plane including line D-D' of FIG. 15B.

As illustrated in FIGS. 15A through 15C, the electronic component module 104 includes the board 10, the electronic components 30 mounted on the board 10, and the shield case 20 mounted on the board 10 and covering the electronic components 30.

The board 10 includes projecting posts 44 at positions along the sidewall 20b of the shield case 20 on the case land 11. As illustrated in FIG. 15B, the projecting posts 44 are provided with one projecting post 44 for each of two adjacent sides of the sidewall 20b. As illustrated in FIG. 15A, the shield case 20 includes a cut 21 at each of positions corresponding to the projecting posts 44. The projecting posts 44 engage with the corresponding cuts 21 so as to pass through the sidewall 20b of the shield case 20. The shield case 20 is positioned on the board 10 by placing the shield case 20 so that the projecting posts 44 and the cuts 21 engage with each other.

As illustrated in FIG. 15C, with the position of the shield case 20 being determined by the projecting posts 44 and the cuts 21 engaging with each other, the shield case 20 has the exterior surface and the interior surface of the sidewall 20b fixed to the board 10 and the projecting posts 44 by the solder 13 on the exterior surface side and the solder 14 on the interior surface side.

Like in the first embodiment, the projecting posts 44 are formed on the case land 11 of the board 10 by a plating process. The projecting posts 44 may have a shape different from that illustrated in this embodiment as long as the projecting posts 44 project from the surface of the board 10 at positions along the sidewall 20b and are so shaped as to engage with the cuts 21 of the shield case 20 to make it possible to position the shield case 20.

According to the electronic component module 104 of the fourth embodiment, the position of the shield case 20 is determined by the projecting posts 44 formed on the board 10, so that the shield case 20 is fixed on the surface of the board 10 without misalignment.

Figure 16:
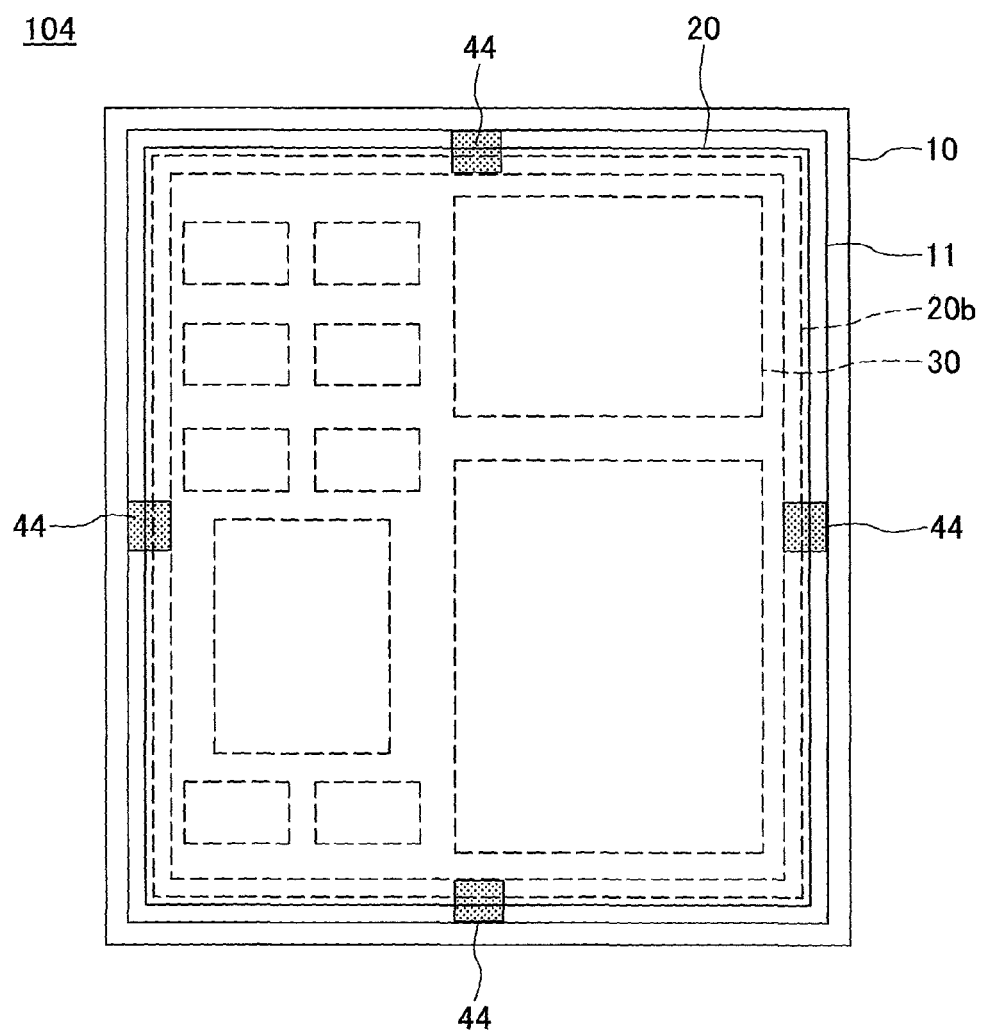
FIG. 16 is a schematic diagram illustrating a configuration of the electronic component module according to the fourth embodiment.

As illustrated in FIG. 16, the projecting posts 44 may be provided with one projecting post 44 for each side of the sidewall 20b. The projecting posts 44 may be provided at positions other than those corresponding to the respective centers of the sides of the sidewall 20b or two or more of the projecting posts 44 may be provided for each side of the sidewall 20b.

Figure 17B:
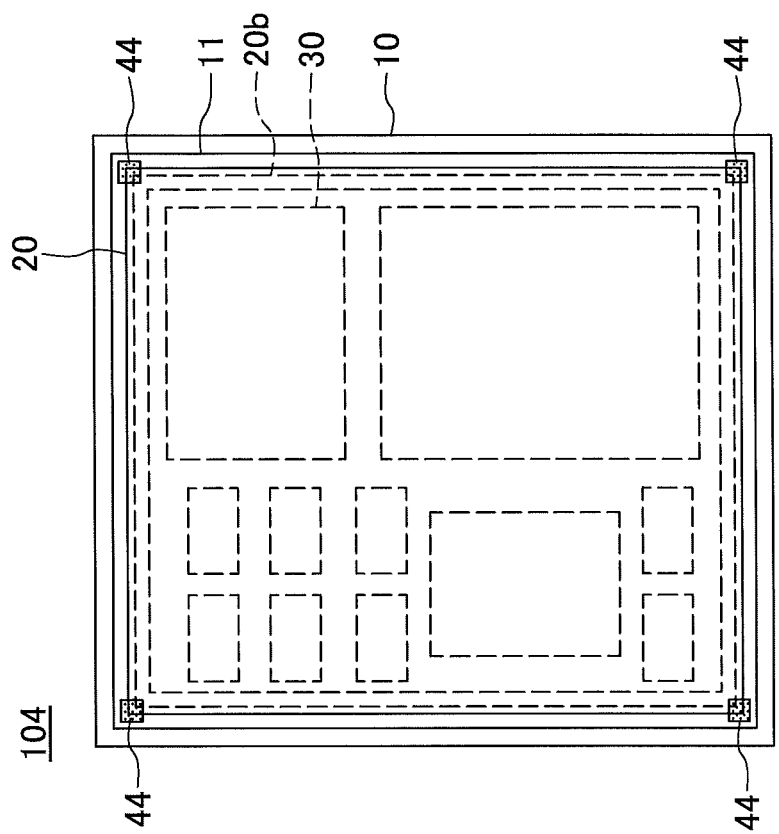
FIGS. 17A and 17B are schematic diagrams illustrating configurations of the electronic component module according to the fourth embodiment.
Figure 17A:
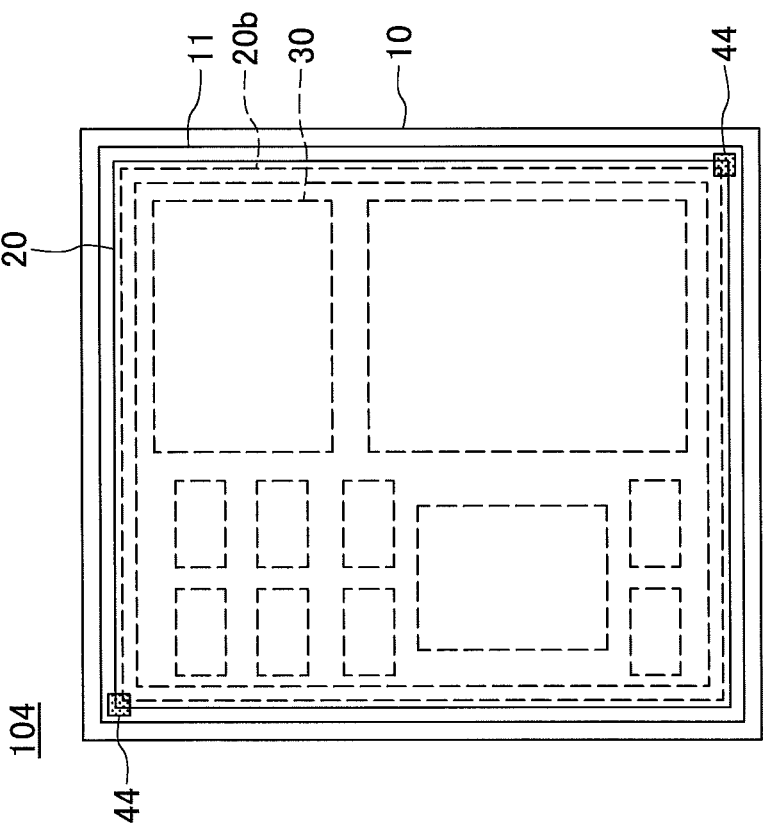

Furthermore, for example, as illustrated in FIG. 17A, the projecting posts 44 may be provided at positions corresponding to diagonal corners of the sidewall 20b of the shield case 20. In this case, the shield case 20 includes cuts at the diagonal corner positions of the sidewall 20b corresponding to the projecting posts 44, and the shield case 20 is positioned by placing the shield case 20 on the board 10 so that the cuts and the projecting posts 44 engage with each other. Alternatively, the projecting posts 44 may be provided at positions corresponding to all the corners of the shield case 20 as illustrated in FIG. 17B, and the shield case 20 may include cuts that engage with the projecting posts 44 at all the corners of the sidewall 20b.

As described above, according to the electronic component module 104 of the fourth embodiment, the position of the shield case 20 is determined by the projecting posts 44 formed on the board 10, so that the shield case 20 is fixed on the surface of the board 10 without misalignment.

[Fifth Embodiment]

Next, a fifth embodiment is described with reference to the drawings. In the fifth embodiment, the same elements as those of the above-described embodiments are referred to by the same reference numerals, and their description is omitted.

FIGS. 18A, 18B and 18C are schematic diagrams illustrating a configuration of an electronic component module 105 according to the fifth embodiment. FIGS. 18A and 18B are a schematic side view and a schematic plan view of the electronic component module 105, respectively. FIG. 18C is a schematic cross-sectional view of the electronic component module 105 taken along a plane including line E-E' of FIG. 18B.

As illustrated in FIGS. 18A through 18C, the electronic component module 105 includes the board 10, the electronic components 30 mounted on the board 10, and the shield case 20 mounted on the board 10 and covering the electronic components 30.

The board 10 includes projecting posts 45 at positions along the sidewall 20b of the shield case 20 on the case land 11. As illustrated in FIG. 18B, the projecting posts 45 are provided with one projecting post 45 for each of two opposite sides of the sidewall 20b. As illustrated in FIG. 18A, the shield case 20 includes the cut 21 at each of positions corresponding to the projecting posts 45.

As illustrated in FIG. 18B, each projecting post 45 includes an engagement part 45a that engages with the corresponding cut 21 of the shield case 20 and an interior extension part 45b that extends along the interior surface of the sidewall 20b. The shield case 20 is positioned on the board 10 by placing the shield case 20 so that the cuts 21 and the engagement parts 45a of the projecting posts 45 engage with each other and the interior surface of the sidewall 20 extends along the interior extension parts 45b of the projecting posts 45.

As illustrated in FIG. 18C, with the position of the shield case 20 being determined by the engagement of the projecting posts 45 and the cuts 21, the shield case has the exterior surface and the interior surface of the sidewall 20b fixed to the board 10 and the projecting posts 45 by the solder 13 on the exterior surface side and the solder 14 on the interior surface side.

Like in the first embodiment, the projecting posts 45 are formed on the case land 11 of the board 10 by a plating process.

Figure 19:
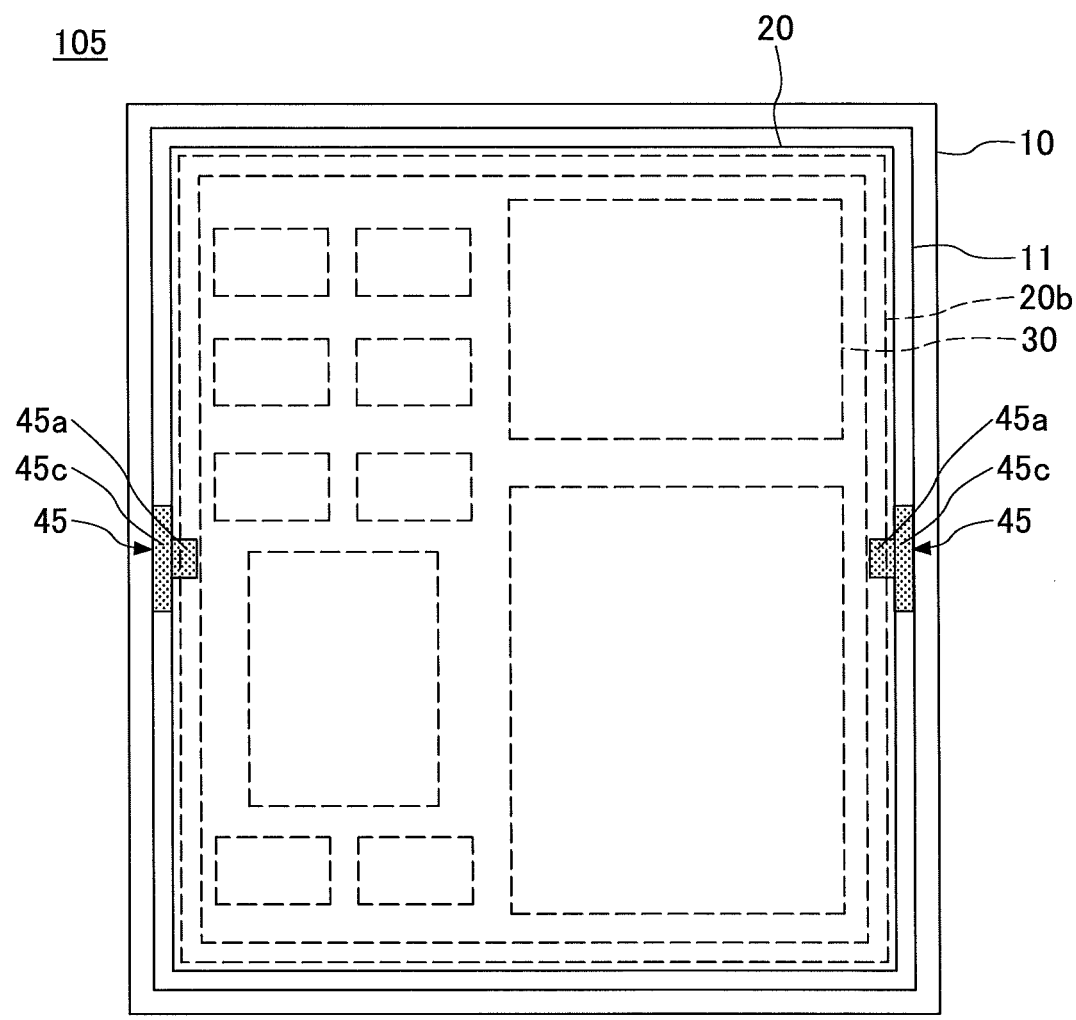
FIG. 19 is a schematic diagram illustrating a configuration of the electronic component module according to the fifth embodiment.

Alternatively, as illustrated in FIG. 19, each projecting post 45 may include the engagement part 45a that engages with the cut 21 of the shield case 20 and an exterior extension part 45c that extends along the exterior surface of the sidewall 20b. The shield case 20 is positioned on the board 10 by placing the shield case 20 so that the cuts 21 and the engagement parts 45a of the projecting posts 45 engage with each other and the exterior surface of the sidewall 20 is along the exterior extension parts 45b of the projecting posts 45.

Figure 20A:
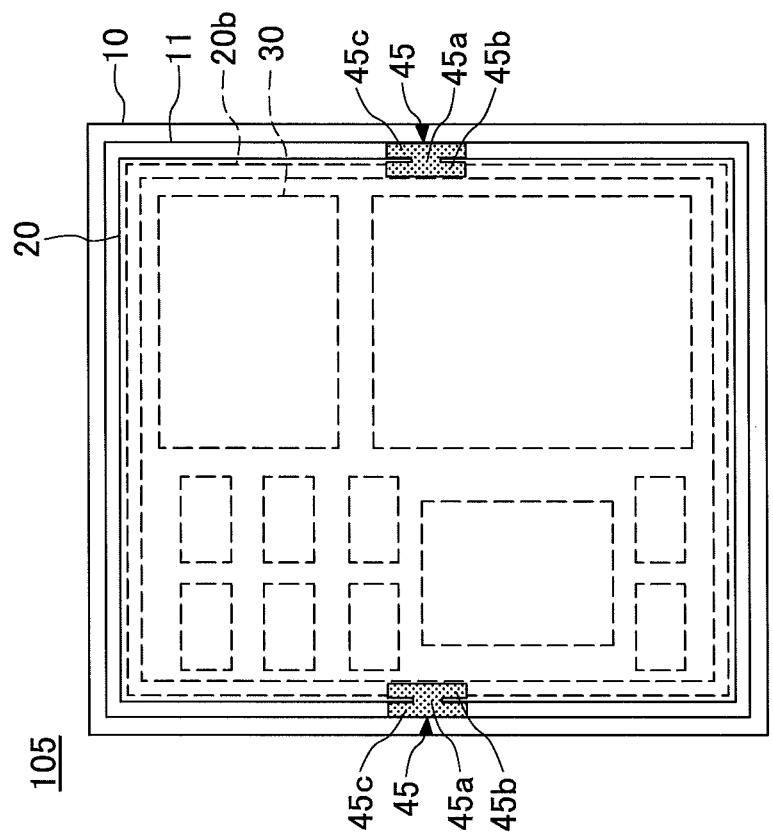
FIGS. 20A and 20B are schematic diagrams illustrating configurations of the electronic component module according to the fifth embodiment.
Figure 20B:
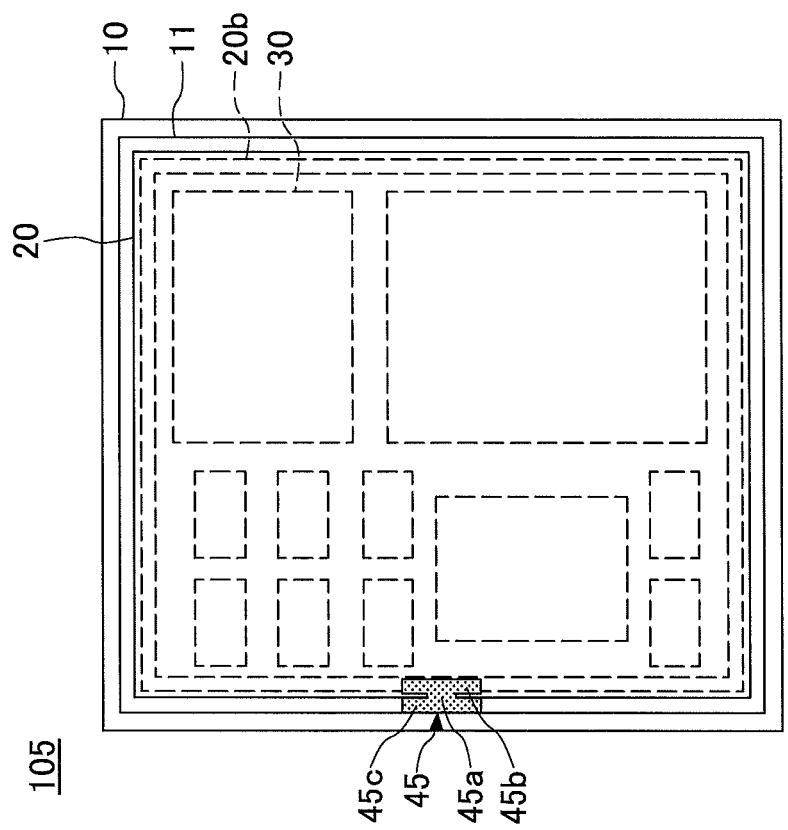

Furthermore, as illustrated in FIG. 20A, each projecting post 45 may alternatively include the engagement part 45a that engages with the corresponding cut 21 of the shield case 20, the interior extension part 45b that extends along the interior surface of the sidewall 20b, and the exterior extension part 45c that extends along the exterior surface of the sidewall 20b. The shield case 20 is positioned on the board 10 by the engagement of the cuts 21 and the engagement parts 45a of the projecting posts 45 and the holding of the sidewall 20b between the interior extension part 45b and the exterior extension part 45c, so that the shield case 20 is fixed on the surface of the board 10 without misalignment. In this case, the projecting posts 45 may be provided with one projecting post 45 for each side of the sidewall 20b or with one projecting post 45 for each of two opposite sides of the sidewall 20b as illustrated in FIG. 20B. Alternatively, the projecting posts 45 may be provided with one or more projecting posts 45 for each of two or more of the sides of the sidewall 20b.

As described above, according to the electronic component module 105 of the fifth embodiment, the position of the shield case 20 is determined by the projecting posts 45 formed on the board 10, so that the shield case 20 is fixed on the surface of the board 10 without misalignment.

[Sixth Embodiment]

Next, a sixth embodiment is described with reference to the drawings. In the sixth embodiment, the same elements as those of the above-described embodiments are referred to by the same reference numerals, and their description is omitted.

FIGS. 21A, 21B and 21C are schematic diagrams illustrating a configuration of an electronic component module 106 according to the sixth embodiment. FIGS. 21A and 21B are a schematic side view and a schematic plan view of the electronic component module 106, respectively. FIG. 21C is a schematic cross-sectional view of the electronic component module 106 taken along a plane including line F-F' of FIG. 21B.

As illustrated in FIGS. 21A through 21C, the electronic component module 106 includes the board 10, the electronic components 30 mounted on the board 10, and the shield case 20 mounted on the board 10 and covering the electronic components 30.

The board 10 includes a projecting post 46 at a position along the sidewall 20b of the shield case 20 on the case land 11. As illustrated in FIG. 21A, the shield case 20 includes the cut 21 at a position corresponding to the projecting post 46 and a projection 22 formed in the cut 21 so as to project toward the board 10. The projecting post 46 is annularly formed, so that the projection 22 is inserted into the center hole of the projecting post 46.

The shield case 20 is positioned on the board 10 by engaging the cut 21 and the projecting post 46 and inserting the projection 22 into the annular projecting post 46.

As illustrated in FIG. 21C, with the position of the shield case 20 being determined by the projecting post 46, the shield case 20 is fixed to the board 10 and the projecting post 46 by soldering the exterior surface and the interior surface of the sidewall 20b to the board 10 and the projecting post 46 by the solder 13 on the exterior surface side and the solder 14 on the interior surface side.

Figure 22:
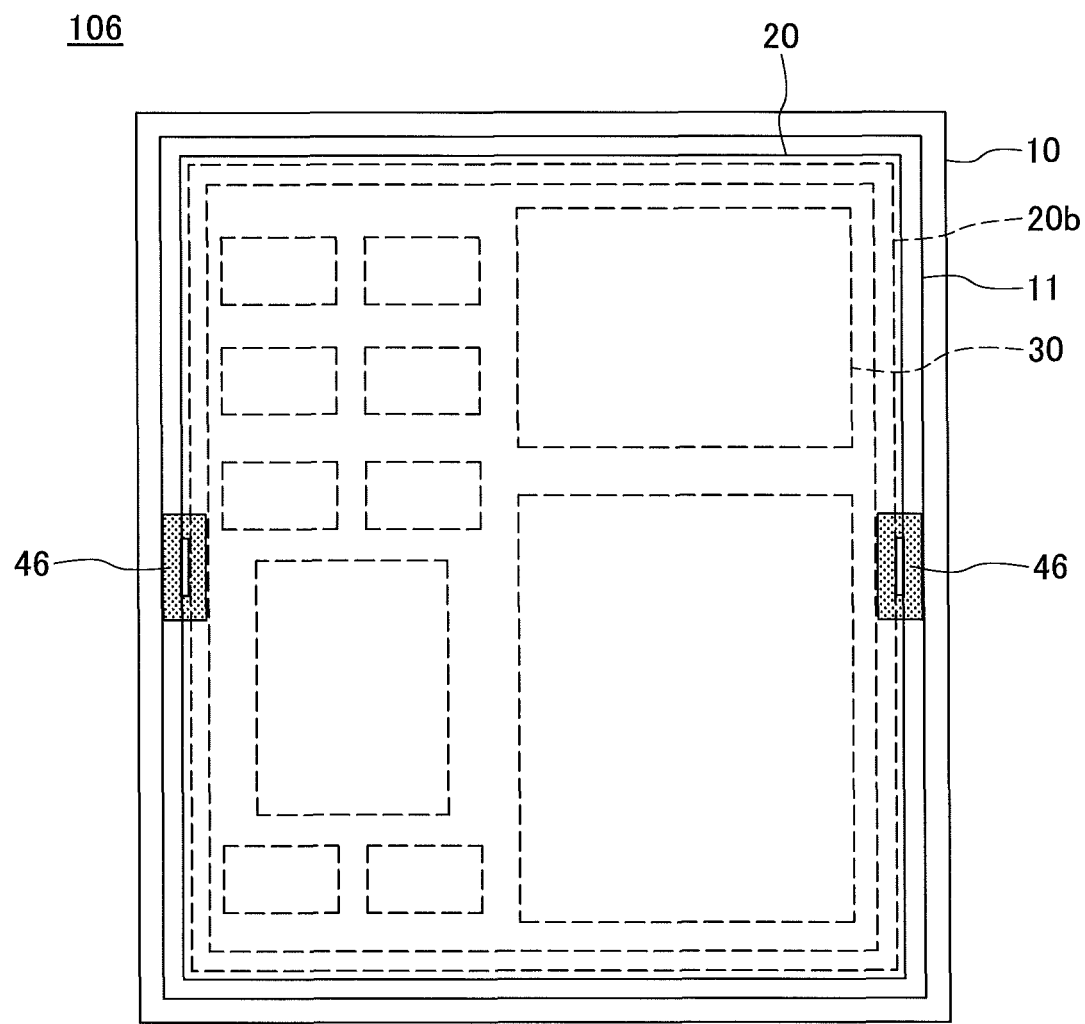
FIG. 22 is a schematic diagram illustrating a configuration of the electronic component module according to the sixth embodiment.

Furthermore, for example, as illustrated in FIG. 22, the projecting post 46 may be provided for each of two opposite sides of the sidewall 20b. Alternatively, one or more projecting posts 46 may be provided for each of two or more of the sides of the sidewall 20b. In the case of FIG. 22, the shield case 20 is positioned on the board 10 by placing the shield case 20 so that the two projections 22 are inserted into the holes of the projecting posts 46.

Furthermore, as illustrated in FIG. 23A, the projecting post 46 may be provided for one of the corners of the sidewall 20b of the shield case 20. In this case, the shield case 20 includes a cut at a position corresponding to the projecting post 46 and a projection projecting toward the board 10 in the cut, and is positioned by inserting the projection into the projecting post 46. The projecting post 46 may be provided for two or more of the corners of the shield case 20. For example, the projecting post 46 may be provided for each of the corners of the shield case 20 as illustrated in FIG. 23B.

As described above, according to the electronic component module 106 of the sixth embodiment, the position of the shield case 20 is determined by the projecting post 46 formed on the board 10, so that the shield case 20 is fixed on the surface of the board 10 without misalignment.

[Seventh Embodiment]

Next, a seventh embodiment is described with reference to the drawings. In the seventh embodiment, the same elements as those of the above-described embodiments are referred to by the same reference numerals, and their description is omitted.

FIGS. 24A, 24B and 24C are schematic diagrams illustrating a configuration of an electronic component module 107 according to the seventh embodiment. FIGS. 24A and 24B are a schematic side view and a schematic plan view of the electronic component module 107, respectively. FIG. 24C is a schematic cross-sectional view of the electronic component module 107 taken along a plane including line G-G' of FIG. 24B.

As illustrated in FIGS. 24A through 24C, the electronic component module 107 includes the board 10, the electronic components 30 mounted on the board 10, and the shield case 20 mounted on the board 10 and covering the electronic components 30.

The board 10 includes projecting posts 47 at positions along the exterior surface of the sidewall 20b of the shield case 20 on the case land 11. The projecting posts 47 are provided with one projecting post 47 for each of two opposite sides of the sidewall 20b. As illustrated in FIGS. 24A and 24B, the shield case 20 includes legs 23 at positions corresponding to the projecting posts 47. The legs 23 extend from an end of the sidewall 20b facing the board 10 along the surface of the board 10. As illustrated in FIG. 24B, a cut 24 that engages with the corresponding projecting post 47 is formed in each leg 23.

The shield case 20 is positioned on the surface of the board 10 by the engagement of the cuts 24 of the legs 23 and the projecting posts 47.

As illustrated in FIG. 24C, with the position of the shield case 20 being determined by the engagement of the cuts 24 of the legs 23 and the projecting posts 47, the exterior surface and the interior surface of the sidewall 20b are fixed to the board 10 and the projecting posts 47 by the solder 13 on the exterior surface side and the solder 14 on the interior surface side.

The case land 11 in this embodiment is formed only at positions corresponding to the legs 23 of the shield case 20. The shield case 20 is fixed to the board 10 by soldering the legs 23 to the case land 11. Furthermore, the shield case 20 is more firmly fixed to the board 10 by soldering the legs 23 to the case land 11 in such a manner as to cover the legs 23 with the solder 13.

Figure 25:
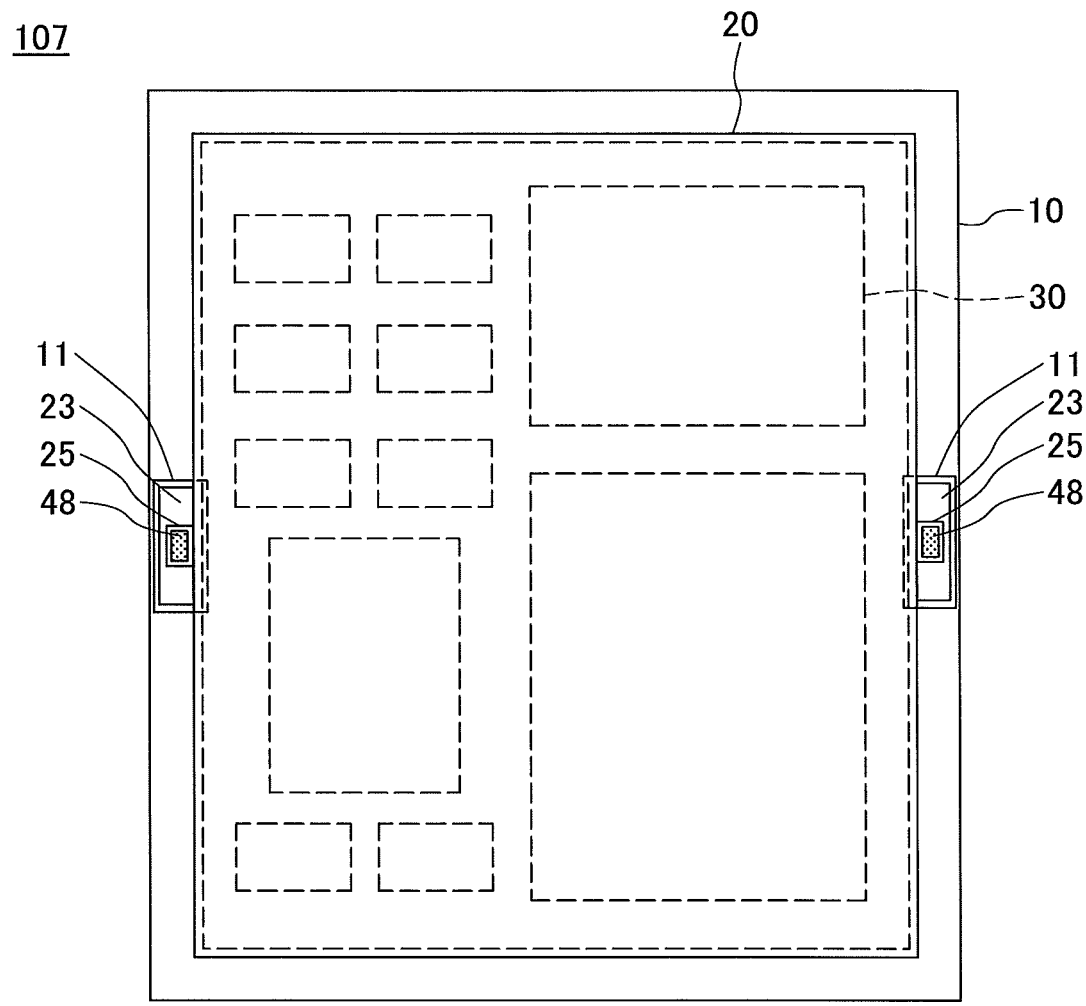
FIG. 25 is a schematic diagram illustrating a configuration of the electronic component module according to the seventh embodiment.

Furthermore, the legs 23 may include respective insertion holes 25 for inserting corresponding projecting posts 48 instead of the cuts 24 as illustrated in FIG. 25. The shield case 20 is positioned on the board 10 by placing the shield case 20 so that the projecting posts 48 are inserted into the insertion holes 25 of the legs 23.

As described above, according to the electronic component module 107 of the seventh embodiment, the position of the shield case 20 is determined by the projecting posts 47 formed on the board 10, so that the shield case 20 is fixed on the surface of the board 10 without misalignment.

Thus, electronic component modules, boards, and methods of manufacturing an electronic component module according to embodiments are described above. All examples and conditional language provided herein, however, are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. An electronic component module, comprising:
    a printed board having an electronic component mounted on a surface thereof, the printed board including a plating layer formed on the surface of the printed board to project therefrom; and
    a shield case mounted on the surface of the printed board and covering the electronic component,
    wherein the plating layer is at a position along a sidewall of the shield case and is soldered to the shield case.

2. The electronic component module as claimed in claim 1, wherein the plating layer includes a projecting post provided along an interior surface of the sidewall of the shield case.

3. The electronic component module as claimed in claim 1, wherein the plating layer includes a projecting post provided along an exterior surface of the sidewall of the shield case.

4. The electronic component module as claimed in claim 3, wherein
    the exterior surface of the sidewall includes an end facing the printed board,
    the shield case includes a leg extending from said end of the exterior surface along the surface of the printed board, and
    the leg is in engagement with the projecting post.

5. The electronic component module as claimed in claim 1, wherein
    the shield case includes a cut in the sidewall, and
    the plating layer includes a projecting post that passes through the sidewall of the shield case in the cut.

6. The electronic component module as claimed in claim 1, wherein
    the shield case includes:
        a cut formed in the sidewall; and
        a projection projecting toward the printed board in the cut, and
    the plating layer includes a projecting post into which the projection is inserted.

7. A printed board on which an electronic component and a shield case covering the electronic component are to be mounted, the printed board comprising:
    a plating layer formed on a surface of the printed board to project therefrom to be soldered to the shield case, the plating layer being at a position along a sidewall of the shield case to be mounted.

8. The printed board as claimed in claim 7, wherein the plating layer includes a projecting post provided along a surface of the sidewall of the shield case.

9. A method of manufacturing an electronic component module, comprising:
    forming a plating layer on a surface of a printed board so that the plating layer projects from the surface of the printed board at a position along a sidewall of a shield case to be mounted on the printed board to cover an electronic component on the printed board; and
    soldering the plating layer and the shield case.

10. The electronic component module as claimed in claim 1, wherein
    the surface of the printed board includes a land,
    the plating layer is formed on the land to project therefrom, and
    the shield case is joined to the land.

11. The electronic component module as claimed in claim 10, wherein the land is formed of copper foil.

12. The electronic component module as claimed in claim 1, wherein each of an interior surface and an exterior surface of the sidewall of the shield case is soldered to the plating layer or the printed board.

13. The printed board as claimed in claim 7, wherein
    the surface of the printed board includes a land, and
    the plating layer is formed on the land to project therefrom.

14. The printed board as claimed in claim 13, wherein the land is formed of copper foil.

15. The method as claimed in claim 9, wherein
    the surface of the printed board includes a land,
    the plating layer is formed on the land to project therefrom, and
    the shield case is joined to the land.

16. The method as claimed in claim 15, wherein the land is formed of copper foil.

17. The method as claimed in claim 9, wherein each of an interior surface and an exterior surface of the sidewall of the shield case is soldered to the plating layer or the printed board.

* * * * *